(12) United States Patent
Miura

(10) Patent No.: US 10,388,369 B2
(45) Date of Patent: Aug. 20, 2019

(54) NONVOLATILE MEMORY CONTROL METHOD, CONTROL DEVICE, AND SEMICONDUCTOR STORAGE DEVICE

(71) Applicant: HITACHI, LTD., Chiyoda-ku, Tokyo (JP)

(72) Inventor: Seiji Miura, Tokyo (JP)

(73) Assignee: HITACHI, LTD., Tokyo (JP)

(*) Notice: Subject to any disclaimer, the term of this patent is extended or adjusted under 35 U.S.C. 154(b) by 0 days.

(21) Appl. No.: 15/566,854

(22) PCT Filed: Apr. 28, 2015

(86) PCT No.: PCT/JP2015/062853
§ 371 (c)(1),
(2) Date: Oct. 16, 2017

(87) PCT Pub. No.: WO2016/174744
PCT Pub. Date: Nov. 3, 2016

(65) Prior Publication Data
US 2018/0108404 A1 Apr. 19, 2018

(51) Int. Cl.
*G06F 12/00* (2006.01)
*G11C 13/00* (2006.01)
*G06F 12/02* (2006.01)

(52) U.S. Cl.
CPC .......... *G11C 13/0004* (2013.01); *G06F 12/00* (2013.01); *G06F 12/02* (2013.01); *G11C 13/0023* (2013.01); *G11C 13/0069* (2013.01); *G11C 13/0097* (2013.01); *G11C 2013/0078* (2013.01); *G11C 2213/75* (2013.01)

(58) Field of Classification Search
CPC ..... G06F 12/00; G06F 12/02; G11C 13/0004; G11C 13/0023; G11C 13/0069; G11C 13/0097; G11C 13/00
USPC ................................. 711/170, 103, 202, 203
See application file for complete search history.

(56) References Cited

U.S. PATENT DOCUMENTS

| 9,645,917 B2 * | 5/2017 | Small ................. G06F 12/0246 |
| 2007/0183198 A1 * | 8/2007 | Otsuka ................. G06F 3/0622 365/185.04 |
| 2011/0164444 A1 | 7/2011 | Fukano |
| 2012/0248399 A1 | 10/2012 | Sasago et al. |
| 2013/0326119 A1 | 12/2013 | Lee et al. |

(Continued)

FOREIGN PATENT DOCUMENTS

| JP | 2002-133877 A | 5/2002 |
| JP | 2011-142186 A | 7/2011 |

(Continued)

OTHER PUBLICATIONS

Office Action dated Apr. 24, 2018 for Japanese Application No. 2017-515329 with English machine translation.

*Primary Examiner* — Pierre Miche Bataille
(74) *Attorney, Agent, or Firm* — Miles & Stockbridge PC

(57) ABSTRACT

Disclosed is a nonvolatile memory control method in which a unit of erase and a unit of read are different from each other. The control method includes: allocating a physical address of the nonvolatile memory to a logical address in a predetermined unit; and controlling a size of the unit of erase in which a physical address allocated to a logical address is included according to a write access state with respect to the logical address in the predetermined unit.

13 Claims, 18 Drawing Sheets

(56) References Cited

U.S. PATENT DOCUMENTS

| | | |
|---|---|---|
| 2014/0223089 A1 | 8/2014 | Kang et al. |
| 2014/0281280 A1 | 9/2014 | Goss et al. |
| 2016/0078932 A1 | 3/2016 | Sasago et al. |
| 2016/0350020 A1* | 12/2016 | Uchigaito ............ G06F 12/0246 |
| 2017/0003911 A1* | 1/2017 | Uchigaito ................ G06F 12/16 |
| 2017/0255389 A1* | 9/2017 | Tan ....................... G06F 3/0605 |

FOREIGN PATENT DOCUMENTS

| | | |
|---|---|---|
| JP | 2012-58770 A | 3/2012 |
| JP | 2013-250982 A | 12/2013 |
| JP | 2014-179086 A | 9/2014 |
| WO | WO 2011/074545 A1 | 4/2013 |
| WO | WO 2014/188484 A1 | 2/2017 |

* cited by examiner

FIG. 13 (A)

| DLAD | WCRATE1 | AWD | WDRATE | BLKFCT | BLKSIZE | PVFCT | PV SIZE |
|---|---|---|---|---|---|---|---|
| 0 TO 63 | 0.36 | 8 | 1.8 | 8.28 | 64 | 0.25 | 32 |
| 64 TO 127 | 0.3 | 8 | 1.5 | 6.9 | 64 | 0.20 | 26 |
| 128 TO 191 | 0.1 | 8 | 0.5 | 2.3 | 128 | 0.068 | 9 |
| 192 TO 255 | 0.1 | 16 | 1 | 1.15 | 256 | 0.137 | 18 |
| 256 TO 319 | 0.05 | 16 | 0.5 | 0.58 | 512 | 0.068 | 9 |
| 320 TO 383 | 0.05 | 32 | 1 | 0.29 | 512 | 0.137 | 18 |
| 384 TO 447 | 0.03 | 32 | 0.6 | 0.17 | 1024 | 0.082 | 11 |
| 448 TO 511 | 0.01 | 64 | 0.4 | 0.03 | 1024 | 0.055 | 7 |

| WRT1AVG | AWDT | LCP | PVAREA |
|---|---|---|---|
| 0.125 | 23 | 64 | 128 |

FIG. 13 (B)

| DLAD | BLKSIZE | DPAD | DPAD SIZE |
|---|---|---|---|
| 0 TO 63 | 64 | 0 TO 63, 512 TO 543 | 96 = 64+32 |
| 64 TO 127 | 64 | 64 TO 127, 544 TO 569 | 90 = 64+26 |
| 128 TO 191 | 128 | 128 TO 191, 570 TO 578 | 73 = 64+9 |
| 192 TO 255 | 256 | 192 TO 255, 579 TO 595 | 82 = 64+18 |
| 256 TO 319 | 512 | 256 TO 319, 594 TO 604 | 73 = 64 + 9 |
| 320 TO 383 | 512 | 320 TO 383, 603 TO 621 | 82 = 64+18 |
| 384 TO 447 | 1024 | 384 TO 447, 622 TO 632 | 75 = 64 +11 |
| 448 TO 511 | 1024 | 448 TO 511, 631 TO 639 | 71 = 64 + 7 |

| PRAREA |
|---|
| 512 TO 639 |

FIG. 14 (A)

| DLAD | WCRATE1 | AWD | WDRATE | BLKFCT | BLKSIZE | PVFCT | PV SIZE |
|---|---|---|---|---|---|---|---|
| 0 TO 63 | 0.48 | 8 | 1.8 | 11.04 | 32 | 0.41 | 53 |
| 64 TO 127 | 0.32 | 8 | 1.5 | 7.3 | 64 | 0.275 | 35 |
| 128 TO 191 | 0.105 | 8 | 0.5 | 2.4 | 128 | 0.09 | 12 |
| 192 TO 255 | 0.05 | 16 | 1 | 0.58 | 512 | 0.086 | 11 |
| 256 TO 319 | 0.02 | 16 | 0.5 | 0.23 | 512 | 0.034 | 4 |
| 320 TO 383 | 0.01 | 32 | 1 | 0.06 | 512 | 0.034 | 4 |
| 384 TO 447 | 0.01 | 32 | 0.6 | 0.06 | 1024 | 0.034 | 4 |
| 448 TO 511 | 0.005 | 64 | 0.4 | 0.01 | 1024 | 0.034 | 4 |

| WRT1AVG | AWDT | LCP | PVAREA |
|---|---|---|---|
| 0.125 | 23 | 64 | 128 |

FIG. 14 (B)

| DLLAD | BLKSIZE | DPAD | DPAD SIZE |
|---|---|---|---|
| 0 TO 63 | 32 | 0 TO 63, 512 TO 564 | 117 = 64+53 |
| 64 TO 127 | 64 | 64 TO 127, 565 TO 599 | 99 = 64+35 |
| 128 TO 191 | 128 | 128 TO 191, 600 TO 610 | 76 = 64+12 |
| 192 TO 255 | 512 | 192 TO 255, 611 TO 621 | 75 = 64+11 |
| 256 TO 319 | 512 | 256 TO 319, 622 TO 626 | 68 = 64+4 |
| 320 TO 383 | 512 | 320 TO 383, 627 TO 630 | 68 = 64+4 |
| 384 TO 447 | 1024 | 384 TO 447, 631 TO 635 | 68 = 64+4 |
| 448 TO 511 | 1024 | 448 TO 511, 636 TO 649 | 68 = 64+4 |

| PRAREA |
|---|
| 512 TO 639 |

NONVOLATILE MEMORY CONTROL METHOD, CONTROL DEVICE, AND SEMICONDUCTOR STORAGE DEVICE

TECHNICAL FIELD

The present invention relates to a semiconductor device, and particularly to a semiconductor device provided with a nonvolatile memory device.

BACKGROUND ART

Recently, a phase change memory using a chalcogenide material as a recording material has been actively researched as a nonvolatile memory device. The phase change memory is a kind of a resistance change memory that stores information using different resistance states of a recording material between electrodes.

In the phase change memory, information is stored using a fact that a resistance value of a phase change material, such as $Ge_2Sb_2Te_5$, is different between an amorphous state and a crystalline state. The resistance is high in the amorphous state (high resistance state) and the resistance is low in the crystalline state (low resistance state). Accordingly, reading of information from the phase change memory is implemented by applying a potential difference to both ends of an element, measuring a current flowing in the element, and discriminating a high resistance state or a low resistance state of the element.

In the phase change memory, data is rewritten by changing electric resistance of a phase change film, made of a phase change material, into a different state using Joule heat generated by current.

FIG. 19 is a graph illustrating a relationship between a pulse width and temperature necessary for a phase change of a resistive storage element using a phase change material. In this drawing, a vertical axis indicates temperature and a horizontal axis indicates time. In the case of writing storage information "0" into this storage element, a reset pulse with which the storage element is heated to temperature equal to or higher than a melting point Ta of a chalcogenide material by causing a large current to flow therein and cooled rapidly is applied as illustrated in FIG. 19. When a cooling time t1 is reduced (for example, set to about 1 ns) in this case, the chalcogenide material becomes a high-resistance amorphous (amorphous) state. On the other hand, in the case of writing storage information "1," a set pulse is applied for a long period in such a manner that a current sufficient for keeping the storage element in a temperature region that is lower than the melting point Ta and higher than a crystallization temperature Tx (equal to or higher than a glass transition point) flows. Accordingly, the chalcogenide material becomes a low-resistance polycrystalline state.

When a resistance element structure is made small in this phase change memory, a current necessary for a change of a state of a phase-change film is decreased. Thus, the phase-change memory is suitable for downsizing, in principle, and has been actively researched. PTL's 1, 2 and 3 disclose a nonvolatile memory having a three-dimensional structure.

PTL's 1 and 3 disclose a configuration in which memory cells each of which includes a variable resistance element and a transistor connected thereto in parallel are connected in series in a stacked direction. In addition, PTL 2 discloses a configuration in which memory cells each of which includes a variable resistance element and a diode connected thereto in series are connected in series in a stacked direction with a conductive line interposed therebetween. In this configuration, for example, a batch writing operation is performed with respect to two memory cells by applying a potential difference to a conductive line between the two memory cells and two conductive lines on an outer side of the two memory cells.

In addition, PTL 3 discloses a method of collectively erasing data stored in an array of N×M memory cells having a three-dimensional structure. Further, it is disclosed that a thermal buffer area is provided such that the Joule heat in an erase operation does not give a great influence to a crystalline state of peripheral memory cells, adjacent to a memory cell array as an erase target. In addition, PTL 4 relates to a nonvolatile memory and discloses that a controller selects one of memory units in response to a workload indicator.

CITATION LIST

Patent Literature

PTL 1: WO 2011/074545 A
PTL 2: JP 2011-142186 A
PTL 3: WO 2014/188484 A
PTL 4: JP 2014-179086 A

SUMMARY OF INVENTION

Technical Problem

Prior to the present application, the present inventors have studied control methods for a NAND-type flash memory that is used in a storage such as an SSD (Solid State Drive) and a memory card. Further, a control method of using a resistance change memory has been studied.

[Study on Control Method of NAND-Type Flash Memory]

In order to write data in a certain memory area, it is necessary to erase data in the memory area in advance, in a nonvolatile memory represented by a NAND-type flash memory. The minimum data unit at this time of erase is, for example, 1M byte or the like (for example, referred to as one block), and the minimum data unit at the time of write is, for example, 8 Kbytes or the like (for example, referred to as one page). In the nonvolatile memory, write is performed in a page having a physical address associated with a logical address in a memory area of one block. At this time, an old page is invalidated in the case of writing new data with the same logical address, and then, the data is written into a new page. If one block is filled with valid pages and invalid pages, further write is not allowed. That is, it is necessary to secure an erased memory area of 1 Mbytes in order to write data of 8 Kbytes. It is necessary to perform an operation called garbage collection inside the SSD in order to secure this erased memory area of 1 Mbytes. This garbage collection operation is started when a free area (the number of erased blocks) becomes equal to or lower than a predetermined value. When it is desired to increase the number of erased blocks by one through this garbage collection operation, it is necessary to select two blocks (memory areas A and B below) at the minimum. The SSD first reads data (page) valid at a current point in time from the nonvolatile memory areas A and B of 1 Mbytes in which data has been written already, and collects and writes these data into a RAM. Next, the nonvolatile memory areas A and B are erased. Finally, the data written in the RAM are collected and written into the nonvolatile memory area A. The nonvolatile memory area B of the 1 Mbytes becomes an erased memory area through this garbage collection operation, and it is possible to write new data in this nonvolatile memory area B. Conventionally, such garbage collection is performed in a memory in which overwrite is not allowed because sizes of a unit of erase and a unit of write are different from each other.

However, data transfer from a certain nonvolatile memory area to another nonvolatile memory area is generated inside the SSD by this garbage collection operation, and write and read requests to the SSD requested from a host controller are hardly executed during a period of this data transfer, but the performance of the SSD deteriorates.

Further, data having a larger size than a write data size requested to the SSD from the host controller is written through this data transfer accompanying the garbage collection operation. Thus, the reliability and product life of the SSD decreases.

The invention of the present application has been made in view of the above-described problems. An object of the invention of the present application is to provide a semiconductor device that implements an increase in performance and an increase in reliability.

Other objects and novel characteristics in addition to the above-described ones of the invention of the present application will be apparent from description of the present specification and the attached drawings.

Solution to Problem

An overview of representatives of the invention to be disclosed in the present application will be simply described as follows.

An aspect of the present invention is a nonvolatile memory control method in which a unit of erase and a unit of write are different from each other. In this method, a physical address of the nonvolatile memory is allocated to a logical address in a predetermined unit, and a size of the unit of erase in which a physical address allocated to a logical address is included is controlled according to a write access state with respect to the logical address in the predetermined unit.

A specific definition of the unit of erase is a "single batch area for management of an erase count", and is an "area erased with a single erase command" or an area of an integral multiple of the "area erased with a single erase command". This unit of erase is sometimes referred to as a block in the present specification. The erase count for each block is managed using an erase count table and the like.

It is possible to consider various methods of evaluating a write access state, and for example, the write access state can be evaluated using at least one of an average write data amount of the logical address in the predetermined unit and a write access count of the logical address in the predetermined unit.

In addition, the write access state can be normalized using at least one of an average write data amount of all logical addresses and a write access count of all logical addresses.

Further, it is also possible to control the size of the unit of erase on consideration of a read access state with respect to the logical address in the predetermined unit.

Further, it is also possible to control an amount of a provisional area included in the allocated physical address according to a write access state with respect to the logical address in the predetermined unit.

Another aspect of the present invention is a nonvolatile memory control device that performs control in the above-described method with respect to various non-volatile memories. As an example of the nonvolatile memory control device, there is a control circuit that allocates a physical address of the nonvolatile memory to a logical address and performs access to the physical address. This control circuit dynamically changes a size of an erase unit block including the physical address associated with the logical address based on an access state with respect to the logical address.

Another aspect of the present invention is a semiconductor storage device including: a nonvolatile memory and a control circuit that allocates a physical address to an input logical address and performs access to the physical address of the nonvolatile memory. The control circuit is characterized by performing write by dynamically changing a block size of a block including the physical address of the nonvolatile memory.

In a preferable mode, the control circuit calculates a first feature amount of a write request to be input to the control circuit per the logical address, and decides the block size of the block including the physical address of the nonvolatile memory based on the first feature amount. As a specific example, the first feature amount is, for example, a feature amount that indicates a logical address with a high access frequency. For example, a block size factor to be described later is a typical example thereof.

Another aspect of the present invention is a semiconductor storage device including: a nonvolatile memory and a control circuit that allocates a physical address to an input logical address and performs access to the physical address of the nonvolatile memory. The control circuit is characterized by performing write by dynamically changing a capacity of the physical address with respect to a capacity of the logical address of the nonvolatile memory.

In a preferable mode, the control circuit calculates a second feature amount of a write request to be input to the control circuit per the logical address, and decides a capacity of a physical address area including a plurality of the physical addresses with respect to a capacity of a logical address area including a plurality of the logical addresses, based on the second feature amount. As a specific example, the second feature amount is, for example, a feature amount that indicates any degree of a rate at which data of the logical address has been written, and a provisional capacity factor to be described later is a typical example thereof. An example of changing a provisional capacity to be described later is exemplified as a specific method of deciding the capacity of the physical address area.

As another aspect of the present invention, a semiconductor device includes a nonvolatile memory and a control circuit that performs access to the nonvolatile memory. The control circuit performs write by calculating a frequency of access to a logical address of a write request input from the outside within a certain period, and changing a block size of the nonvolatile memory based on this access frequency. Accordingly, a block size of a block including a physical address associated with a logical address with a high access frequency decreases, and an amount of valid data inside the block is reduced. Accordingly, a data copy amount at the time of garbage collection decreases, and a copy time is shortened. Thus, standby time for write and read requests input from the outside is shortened, and data transmission speed of a semiconductor device is improved in the control circuit. Herein, it is possible to grasp the block as the unit of erase at the time of performing the garbage collection.

Advantageous Effects of Invention

An effect that can be obtained by the representatives of the invention to be disclosed in the present application will be simply described as follows.

That is, it is possible to provide a semiconductor device provided with a nonvolatile memory with high performance, high reliability and low cost.

BRIEF DESCRIPTION OF DRAWINGS

FIGS. 13(A) and 13(B) are tables illustrating a block size table BLKTBL and an address conversion table DLPTBL.

FIGS. 14(A) and 14(B) are tables illustrating the block size table BLKTBL and the address conversion table DLPTBL.

DESCRIPTION OF EMBODIMENTS

Figure 1:
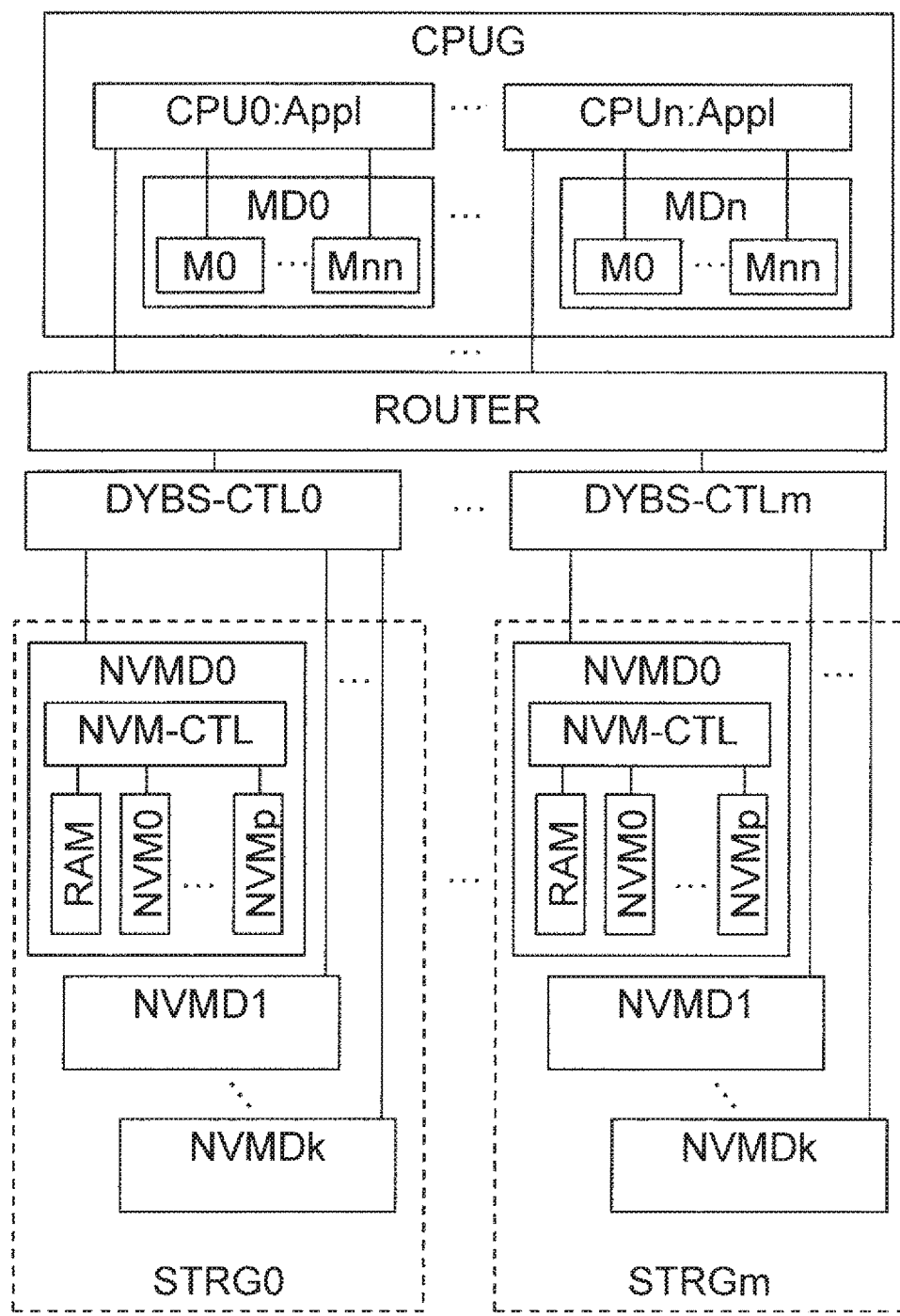
FIG. 1 is a block diagram illustrating a schematic configuration example of an information processing system to which a semiconductor device according to an embodiment is applied.

In the following embodiments, the description will be divided into multiple sections or embodiments if necessary for the sake of convenience. The divided sections or embodiments are not irrelevant to each other and are in such a relation that one is a modification example, an application example, a detailed description, a supplementary description or the like of a part or all of another one, unless particularly stated otherwise. In addition, in the embodiments below, when the number of elements and the like (including the number, a numeric value, a quantity, a range, and the like) are stated, the embodiment is not limited to a particular number excepting the case that is particularly demonstrated or a case in which the embodiment is clearly limited, in principle, to the particular number, and the number may be equal to or more than or less than the particular number.

Further, the constituent components (including component steps and the like) are not necessarily required, excepting the case that is particularly demonstrated or a case in which the components are clearly required, in principle, in the following embodiments. Similarly, in the embodiments below, when shapes, positional relationships and the like of the constituent components are stated, it is assumed that those substantially approximate to or analogous to the shapes and the like are included excepting the case that is particularly demonstrated or a case in which the components are obviously inappropriate in principle. This also applies similarly to the above-described numbers (including the number of parts, numeric values, amount, ranges, and the like).

Hereinafter, embodiments of the present invention will be described in detail based on the drawings. Incidentally, the same or relevant reference numerals will be attached to members having the same function in the entire drawing for describing the embodiments, and the repetitive description thereof will be omitted. In addition, the description of the same or similar portions will not be repeated in principle unless particularly required in the following embodiments.

Circuit elements forming each block are not particularly limited in the embodiments, and are formed on a single semiconductor substrate such as single crystal silicon using an integrated circuit technology, such as a known CMOS (complementary MOS transistor). In addition, it is assumed that a resistive storage element, such as a phase change memory and a ReRAM (Resistive Ramdam Access Memory), is assumed as a memory cell to be described in the embodiments.

<Overview of Information Processing System>

FIG. 1 is a block diagram illustrating a schematic configuration example of an information processing system to which a semiconductor device according to an embodiment is applied. The information processing system illustrated in FIG. 1 includes an information processing device CPUG, a router device ROUTER, control devices DYBS-CTL0 to m, and storage devices STRG0 to m.

The information processing device CPUG includes information processing circuits CPU0 to n and CPU memory modules MD0 to n although not particularly limited. Each of the CPU memory modules MD0 to n includes memory devices M0 to nn.

Each of the storage devices STRG0 to m includes nonvolatile memory modules NVMD0 to k.

Each of the nonvolatile memory modules NVMD0 to k includes nonvolatile memory devices NVM0 to p, a random access memory RAM, and a control circuit NVM-CTL that controls these nonvolatile memory devices and random access memories. The nonvolatile memory devices NVM0 to NVMp include the same configuration and performance, for example.

An operating system, an application program, and data, which operate using the information processing circuits CPU0 to n, are stored in each of the nonvolatile memory devices NVM0 to p of the nonvolatile memory modules NVMD0 to k.

In addition, a secondary block size table BLKTBL2, which represents associations of management block sizes with respect to physical address areas DPAD of the memory modules NVMD0 to k, managed using control devices DYBS-CTL0 to m, and a secondary address conversion table DLPTBL2 of the physical addresses DPAD of the memory modules NVMD0 to 31 associated with a logical address DLAD, are stored in the nonvolatile memory devices NVM0 to p. Incidentally, the control device DYBS-CTL also has each copy of the block size table and the address conversion table. For convenience, a table included in the control device DYBS-CTL will be referred to as a primary table, and a table included in the nonvolatile memory modules NVMD0 to k will be referred to as a secondary table.

In addition, a logical address LAD from the information processing device CPUG managed by the control circuit NVM-CTL, the secondary address conversion table DLPTBL2 that performs association with physical address PAD of the nonvolatile memory devices NVM0 to p inside the memory modules NVMD0 to k, an erase count table ERSTBL for each block, and an address map ADMAP are stored in the nonvolatile memory devices NVM0 to p. However, the secondary block size table, the address conversion table, the erase count table, the address map, and the like may be stored in a dedicated memory that is separately provided in the control circuit or the control device.

Hereinabove, each of n, nn, m, p, and k is assumed to represent a natural number.

The nonvolatile memory modules NVMD0 to p correspond to, for example, an SSD (Solid State Drive) and the like although not particularly limited.

Any of the information processing circuits CPU0 to n of the information processing device CPUG reads the operating system, the application program, and the data, stored in the nonvolatile memory devices NVM0 to p of the storage devices STRG0 to m through the router device ROUTER and the control devices DYBS-CTL0 to m, and transfers the read operating system, application program, and data to the CTL memory modules MD0 to n to be saved therein. Thereafter, the information processing circuits CPU0 to n use the data saved in the memory modules MD0 to n, and execute the operating system and the application program.

When the information processing circuits CPU0 to n store a result of execution of the application program in the storage devices STRG0 to m, the result is stored in the nonvolatile memory device NVM0 to NVMp inside the storage devices STRG0 to m through the router device ROUTER and the control devices DYBS-CTL0 to m.

The information processing device CPUG manages the data saved in the storage devices STRG0 to m using the logical address (LAD) in the minimum unit of 512 bytes.

The router device ROUTER is an device that transmits a read command, a write command, and data, from the information processing device CPUG to the control devices DYBS-CTL0 to m, and further, transmits data from the control devices DYBS-CTL0 to m to the information processing device CPUG.

Figure 2:
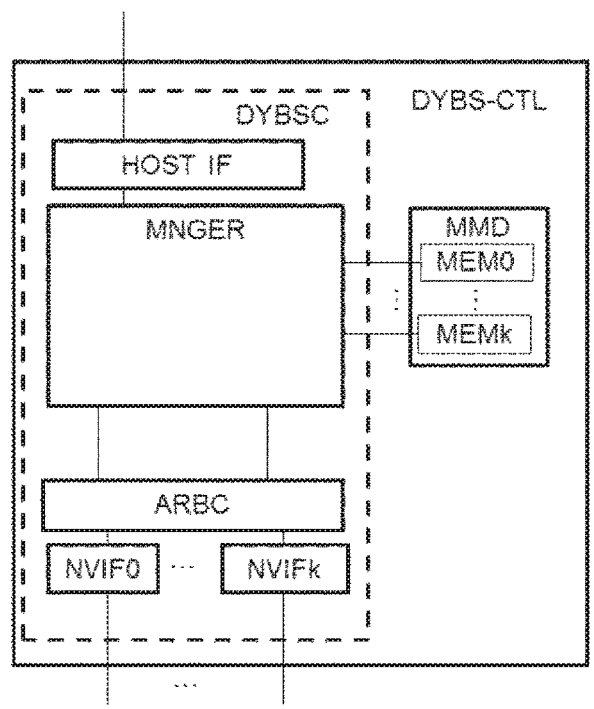
FIG. 2 is a block diagram illustrating a configuration example of a control circuit in FIG. 1.

FIG. 2 illustrates a configuration of the control device DYBS-CTL.

The control devices DYBS-CTL0 to m read the secondary block size table BLKTBL2, stored in the nonvolatile memory devices NVM0 to NVMp of the storage devices STRG0 to m, and transmit the read table to the memory device MMD in the control devices DYBS-CTL0 to m. As a result, the memory device MMD has a primary block size table BLKTBL1 which is a copy of the secondary block size table.

In addition, the control devices DYBS-CTL0 to m are controllers that manage the data saved in the storage devices STRG0 to m using the logical address (LAD) in the minimum unit (sector unit) of 512 bytes.

In addition, the control devices DYBS-CTL0 to m respond to the read and the write commands from the information processing device CPUG through the router device ROUTER and perform read and write of data with respect to the memory modules NVMD0 to k through an interface signal HDH_IF.

At this time, the control devices DYBS-CTL0 to m decide the physical addresses DPAD of the memory modules NVMD0 to k with respect to the logical address LAD input from the information processing device CPUG through the router device ROUTER, and perform read and write of data with respect to the memory modules NVMD0 to k.

Further, the control devices DYBS-CTL0 to m analyze features of read and the write access from the information processing device CPUG, dynamically change each management block size of the memory modules NVMD0 to k with respect to the physical address area DPAD to be optimum, and updates the primary block size table BLKTBL1 in the memory device MMD. Accordingly, performance and reliability of the information processing system are improved.

The control circuit NVM-CTL in the memory modules NVMD0 to k reads the secondary address conversion table DLPTBL2 stored in the nonvolatile memory devices NVM0 to p, an erase count table ERSTBL for each block, and an address map ADDMAP, transmits the secondary address conversion table DLPTBL2 and the erase count table ERSTBL for each block to the memory device RAM in the memory modules NVMD0 to k, and reads and transmits the address map ADDMAP to a map register MAPREG.

When the memory control circuit NVM-CTL writes data into the nonvolatile memory devices NVM0 to p, the physical page addresses PAD of the nonvolatile memory devices NVM0 to p are determined such that write counts per blocks to manage the nonvolatile memory devices NVM0 to p are leveled, and the secondary address conversion table DLPTBL2 is updated.

In addition, when the memory control circuit NVM-CTL reads data from the nonvolatile memory devices NVM0 to p, the memory control circuit NVM-CTL refers to the secondary address conversion table DLPTBL2 and decides the physical address PAD with respect to the logical address LAD, and reads data stored in the physical address PAD.

Further, the memory control circuit NVM-CTL reconstructs the secondary address conversion table DLPTBL2, the erase count table ERSTBL for each block, and the address map ADDMAP based on the information of the secondary block size table BLKTBL2 according to instructions from the control devices DYBS-CTL0 to m after the control devices DYBS-CTL0 to m update the primary block size table BLKTBL1. Accordingly, performance and reliability of the memory modules NVMD0 to k are improved.

FIG. 2 is a block diagram illustrating a configuration example of the control devices DYBS-CTL0 to m in FIG. 1. The control device DYBS-CTL illustrated in FIG. 2 includes a control block DYBSC and a memory module MMD.

The control block DYBSC is configured of an interface circuit HOSTIF, an information processing circuit MNGER, an arbitration circuit ARBC, and interface circuits NVIF0 to k with respect to the memory modules NVMD0 to k. The memory module MMD includes memory devices MEM0 to MEMk.

The primary block size table BLKTBL1 indicating a block size for each of the logical addresses DLAD and a primary address conversion table DLPTBL1 of the physical address DPAD of the memory modules NVMD0 to k, which is associated with the logical address DLAD, are saved in the memory module MMD.

In addition, the divided logical address DLAD indicates a logical address area including the plurality of logical addresses LAD, and the physical address DPAD indicates the physical address area including the plurality of physical addresses PAD.

A read operation of the control device DYBS-CTL will be described. A read request (RQ) from the information processing device CPUG is input through the router device ROUTER. The read request (RQ) includes the logical address (LAD), a data read command (RD), a sector count (SEC), and the like.

The control device DYBS-CTL refers to the primary address conversion table DLPTBL1 stored in the memory device MMD, reads a physical address DPAD0 associated with the divided logical address DLAD including the logical address LAD, selects the memory module NVMD0 in which data of the logical address LAD is stored based on the physical address DPAD0, and transmits the read request (RQ).

The secondary address conversion table DLPTBL2 is referred to in the memory module NVMD0, and data DTAT0 corresponding to the sector count is read among data stored in the physical page address PAD associated with the logical address LAD.

The read data DATA0 is transmitted to the control device DYBS-CTL, and further transmitted to the information processing device CPUG through the router device ROUTER.

A write operation of the control device DYBS-CTL will be described. A write request (WQ) from the information processing device CPUG is input through the router device ROUTER. The write request (WQ) includes the logical address (LAD), a data write command (WT), the sector count (SEC), and the like.

The control device DYBS-CTL refers to the primary address conversion table DLPTBL1 stored in the memory device MMD, reads a physical address DPAD1 associated with the logical address DLAD including the logical address LAD, selects the memory module NVMD1 in which data of the logical address LAD is stored based on the physical address DPAD1, and transmits the write request (WQ).

The physical address PAD is decided in the memory module NVMD1 so as to level the write counts of the blocks, and data DTAT1 corresponding to the sector count is written into the physical address PAD. Thereafter, the secondary address conversion table DLPTBL2 is updated, and the logical address LAD and the latest physical address PAD are associated with each other.

Figure 3:
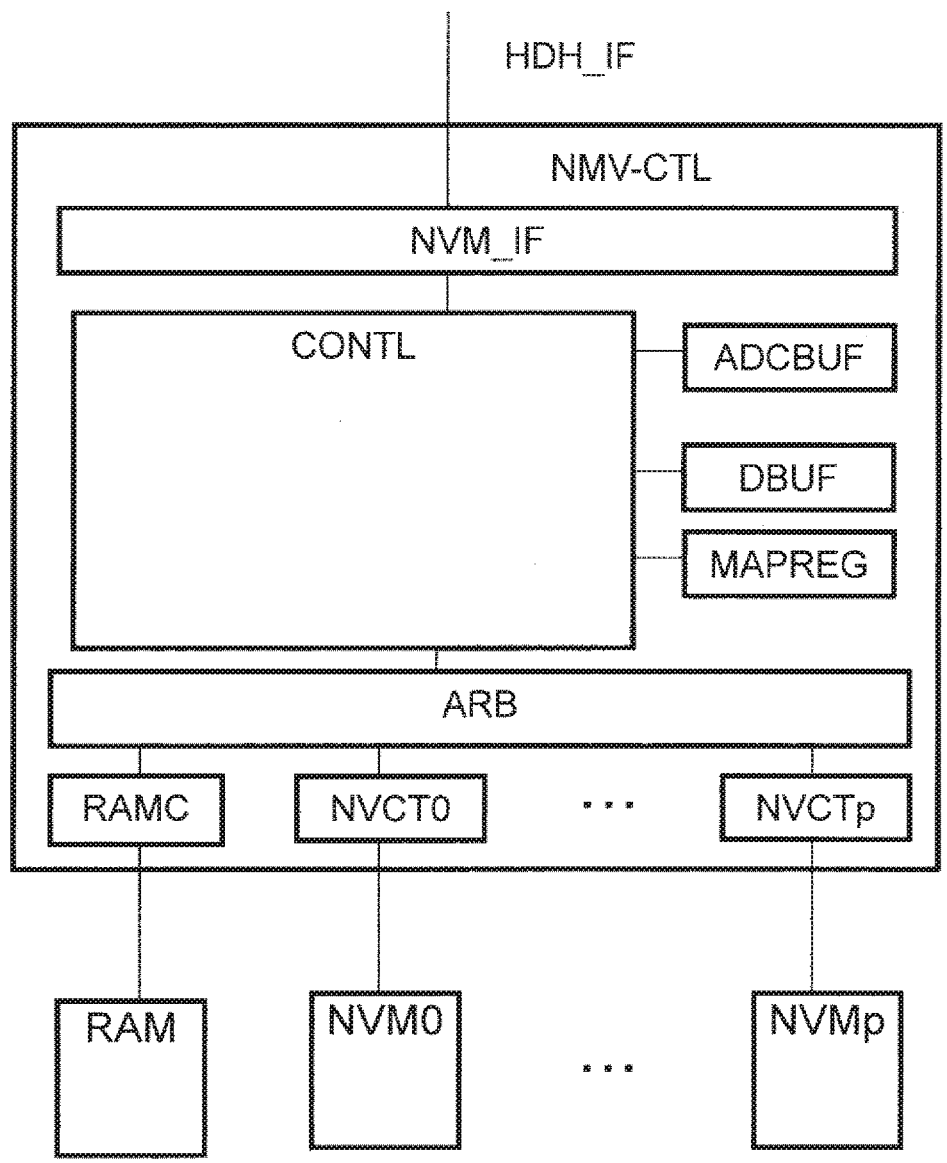
FIG. 3 is a block diagram illustrating a configuration of a control circuit inside a memory module in FIG. 1.

FIG. 3 is a block diagram of the memory control circuit NVM-CTL of the memory modules NVMD0 to k in FIG. 1.

The memory control circuit NVM-CTL includes an interface circuit NVM_IF, an address/command buffer ADCBUF, a data buffer DBUF, the map register MAPREG, the arbitration circuit ARB, the information processing circuit CONTL, a memory control circuit RAMC of the RAM, a memory control circuit NVCT0p of the nonvolatile memory devices NVM0 to p. The memory control circuit RAMC directly controls the random access memory RAM of FIG. 1, and the memory control circuits NVCT0 to p directly control the nonvolatile memory devices NVM0 to p of FIG. 1.

The data buffer DBUF temporally stores write data and read data of the nonvolatile memory devices NVM0 to p.

The address/command buffer ADCBUF temporally stores the logical address LAD input to the memory control circuit NVM-CTL from the control device DYBS-CTL, the data read command (RD), and the data write command (WT).

The secondary address conversion table DLPTBL2 and the erase count table ERSTBL for each block are saved in the memory device RAM.

The address map ADDMAP is stored in the map register MAPREG, and the map register MAPREG indicates an association among an X address, a Y address, and a Z address inside the nonvolatile memory devices NVM0 to p for each one block size.

Further, the memory control circuit NVM-CTL reconstructs the secondary address conversion table DLPTBL2, the erase count table ERSTBL for each block, and the address map ADDMAP based on the information of the secondary block size table BLKTBL2 according to instructions from the control devices DYBS-CTL0 to m. Accordingly, the performance and reliability of the memory modules NVMD0 to k are improved.

Figure 4:
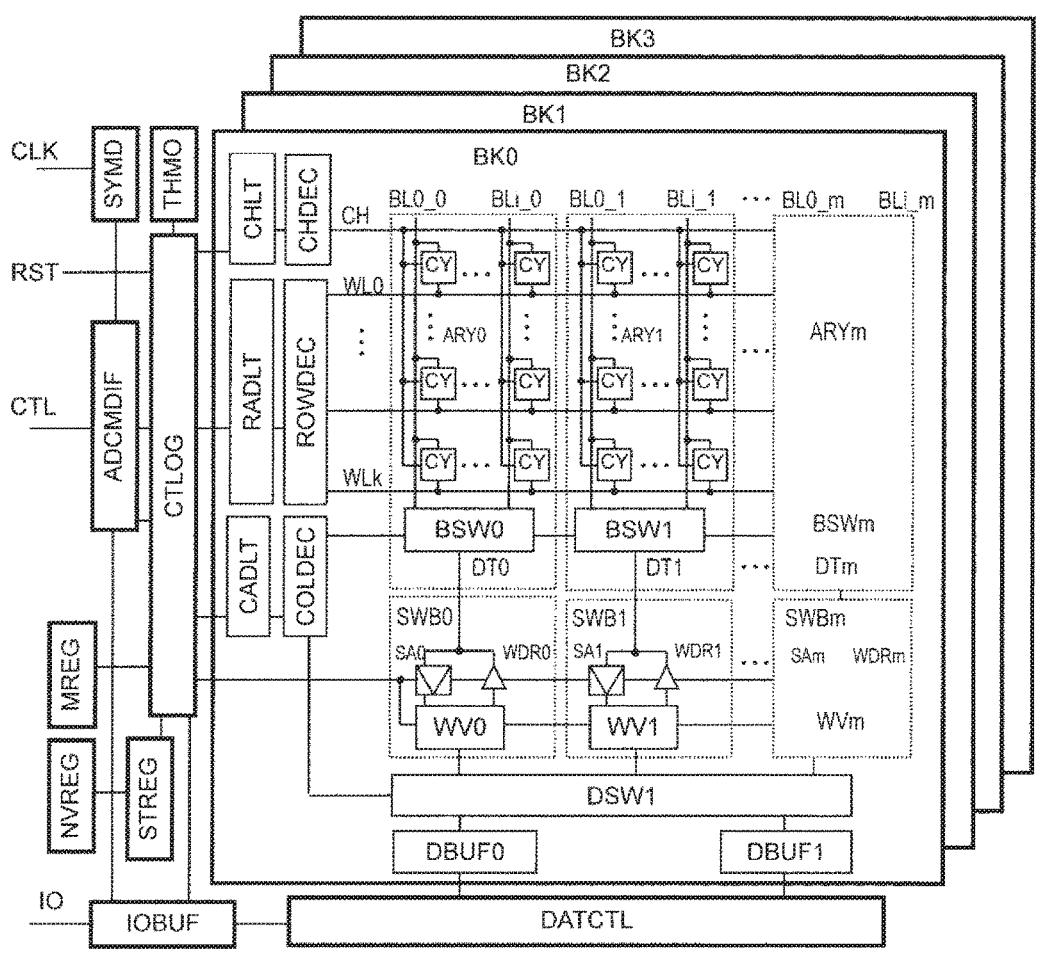
FIG. 4 is a block diagram illustrating a configuration example of nonvolatile memory devices NMV0 to 31 in FIG. 1.
Figure 5:
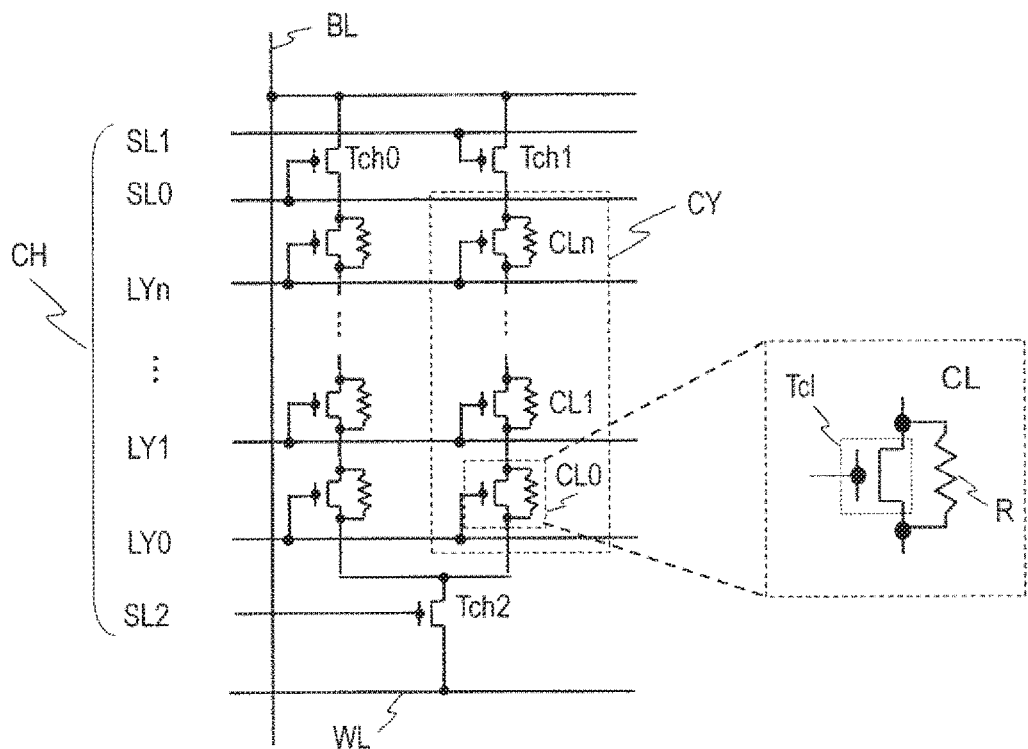
FIG. 5 is a circuit diagram illustrating a configuration example of a chain memory array in FIG. 4.

FIG. 4 is a block diagram illustrating a configuration example of the nonvolatile memory devices NVM0 to p in FIG. 1, and FIG. 5 is a circuit diagram illustrating a configuration example of a chain memory array in FIG. 4.

The nonvolatile memory device illustrated to FIG. 4 corresponds to each of the nonvolatile memory devices NVM0 to pin FIG. 1. Although a phase change nonvolatile memory (phase change memory) is used as an example herein, a flash memory or another resistance change memory may be used. The nonvolatile memory device includes a clock generation circuit SYMD, a status register STREG, an erase size designating register NVREG, an address-command interface circuit ADCMDIF, an IO buffer IOBUF, a control circuit CTLOG, a temperature sensor THMO, a data control circuit DATCTL, and memory banks BK0 to BK3.

Each of the memory banks BK0 to BK3 includes memory arrays ARYx (x=0 to m), read/write control blocks SWBx (x=0 to m) provided in association with each of the memory arrays, and various peripheral circuits to control the memory arrays ARYx and read/write control blocks SWBx. The various peripheral circuits include a row address latch RADLT, a column address latch CADLT, a row decoder ROWDEC, a column decoder COLDEC, a chain selection address latch CHLT, a chain decoder CHDEC, a chain selection circuit DSW1, and data buffers DBUF0 and DBUF1.

Each of the memory arrays ARYx (x=0 to m) includes a plurality of chain memory arrays CY, arranged at intersections between a plurality of word lines WL0 to WLk and a plurality of bit lines BL0_x to BLi_x, and a bit line selection circuit BSWx which selects any of the plurality of bit lines BL0_x to BLi_x (x=0 to m) and connects the selected bit line to a data line DTx. Each of the read/write control blocks SWBx (x=0 to m) includes sense amplifiers SAx (x=0 to m) and write drivers WDRx (x=0 to m), which are connected to the data lines DTx (x=0 to m), and write data verification circuits WVx (x=0 to m) that perform verification of data using the sense amplifies SAx and the write drivers WDRx at the time of the write operation. In addition, when a memory interface, such as a NAND-type flash memory interface and a DRAM interface, is employed as an interface that causes the operation of the nonvolatile memory device illustrated in FIG. 4, it is possible to keep interface compatibility with a conventional system, and it is possible to provide the highly convenient nonvolatile memory device.

Further, a block size that can be erased with a single command is not physically fixed in the nonvolatile memory device illustrated in FIG. 4, and can be easily changed as a unit of management upon control using the memory control circuit NVM-CTL. Thus, it is possible to achieve improvement of the performance and reliability of the information processing system by analyzing the feature of access of the information processing device CPUG to the memory module NVMD and dynamically optimizing the block size of the nonvolatile memory device.

As illustrated in FIG. 5, each of the chain memory arrays CY has a configuration in which a plurality of phase change memory cells CL0 to CLn are connected in series, and an end thereof is connected to the word line WL via a chain selection transistor Tch2, and the other end thereof is connected to the bit line BL via chain selection transistors Tch0 and Tch1. The plurality of phase change memory cells CL0 to CLn are sequentially stacked in a height direction with respect to the semiconductor substrate and are connected to each other in series although not illustrated. In addition, each of the phase change memory cells CL includes a variable resistance storage element R and a memory cell selection transistor Tc1 connected thereto in parallel. The storage element R is made of, for example, a chalcogenide material.

In the example of FIG. 5, the two chain memory arrays CY share the chain selection transistor Tch2, the chain selection transistors Tch0, 1 and 2 in the respective chain memory arrays are controlled by chain memory array selection lines SL0, SL1 and SL2, respectively, and accordingly any one chain memory array is selected. In addition, memory cell selection lines LY (LY0 to LYn) are connected to gate electrodes of the associated phase change memory cell, the memory cell selection transistors Tc1 in the phase change memory cells CL0 to CLn are controlled, respectively, by the memory cell selection lines LY, and accordingly, each of the phase change memory cells is suitably selected. Incidentally, the chain memory array selection lines SL0, SL1 and SL2 and the memory cell selection lines LY0 to LYn are suitably driven via the chain selection address latch CHLT and the chain decoder CHDEC illustrated in FIG. 4, as a chain control line CH.

Next, the operation of the nonvolatile memory device in FIG. 4 will be briefly described. In FIG. 4, the control circuit CTLOG first receives the control signal CTL via the address-command interface circuit ADCMDIF. The control signal CTL includes, for example, a command/latch enable signal (CLE), a chip enable signal (CEB), an address/latch signal (ALE), a write enable signal (WEB), a read enable signal (REB), and a ready busy signal (RBB), although not particularly limited, and the write command or the read command is issued using combinations thereof. In addition, the control circuit CTLOG receives an input/output signal IO via the IO buffer IOBUF together with the control signal CTL. The input/output signal IO includes an address signal, and the control circuit CTLOG extracts a row address and a column address from the address signal. The control circuit CTLOG suitably generates an internal address based on the row address, the column address, units of write and read set in advance, and the like, and transmits the generated internal address to the row address latch RADLT, the column address latch CADLT and the chain selection address latch CHLT.

The row decoder ROWDEC receives output of the row address latch RADLT and performs selection of the word lines WL0 to WLk, and the column decoder COLDEC receives output of the column address latch CADLT and performs selection of the bit lines BL0_x to BLi_x (x=0 to m). In addition, the chain decoder CHDEC receives output of the chain selection address latch CHLT and performs selection of the chain control line CH. When the read command is input by the control signal CTL, data are read from the chain memory arrays CY selected by the combination of the word line, the bit line, and the chain control line, described above, via the bit line selection circuits BSW0 to BSWm. This read data are amplified by the sense amplifiers SA0 to SAm, and transmitted to the data buffer DBUF0 (or DBUF1) via the data selection circuit DSW1. Then, the data on the data buffer DBUF0 (or DBUF1) are sequentially transmitted to the input/output signal IO via the data control circuit DATCTL and the IO buffer IOBUF.

Meanwhile, when the write command is input by the control signal CTL, a data signal is transmitted to the input/output signal IO continuously to the above-described address signal, and the data signal is input to the data buffer DBUF0 (or DBUF1) via the data control circuit DATCTL. The data signal on the data buffer DBUF0 (or DBUF1) is written into the chain memory array CY selected by the combination of the word line, the bit line, and the chain control line via the data selection circuit DSW1, the write drivers WDR0 to WDRm, and the bit line selection circuits BSW0 to BSWm. In addition, at this time, the write data verification circuits WV0 to WVm verify whether a write level reaches a sufficient level while suitably reading the written data via the sense amplifiers SA0 to SAm, and performs the write operation again using the write drivers WDR0 to WDRm until the write level reaches the sufficient level.

Figure 6:
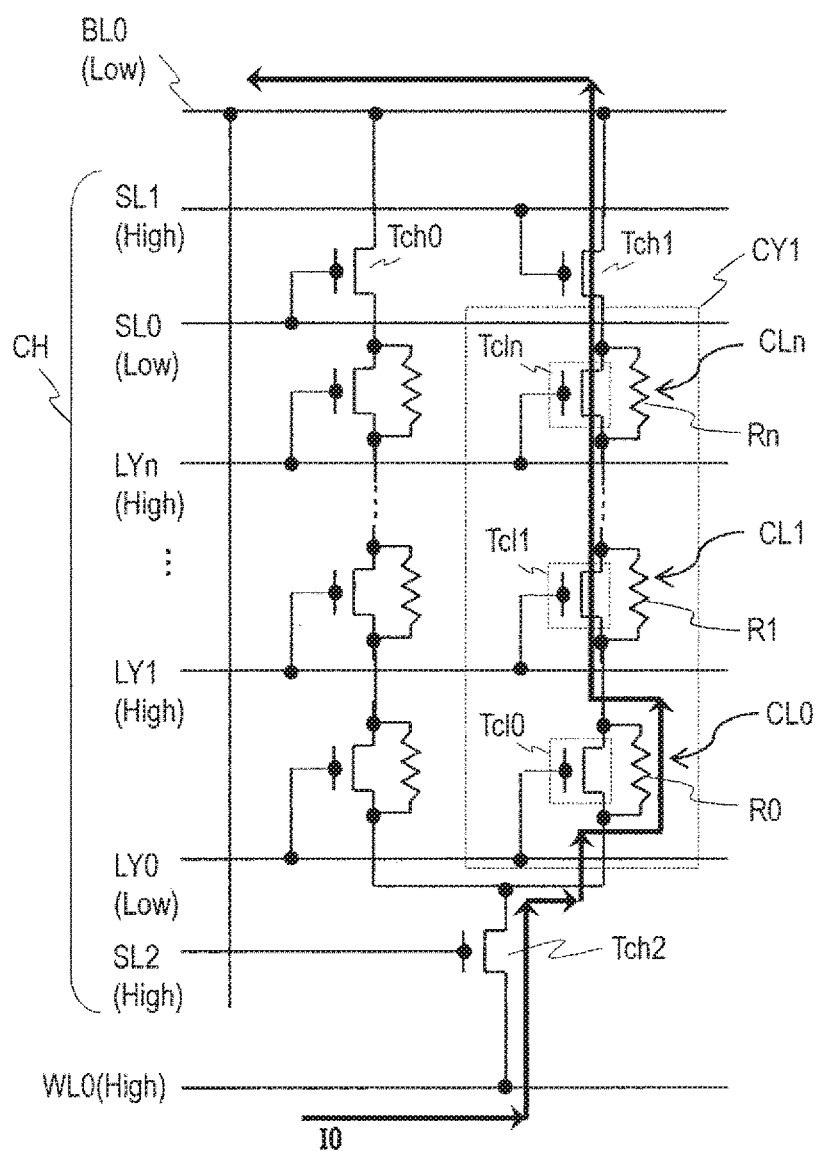
FIG. 6 is a circuit diagram illustrating an operation example of the chain memory array in FIG. 5.

FIG. 6 is an explanatory diagram illustrating an operation example of the chain memory array in FIG. 5. A description will be given regarding an operation at the time of setting a variable resistance storage element R0 of the phase change memory cell CL0 in the chain memory array CY1 to a high resistance or a low resistance, for example, with reference to FIG. 6. Only the chain memory array selection line SL1 is activated (SL0=Low, SL1=High, SL2=High) by the chain decoder CHDEC, and the chain selection transistors Tch1 and Tch2 become a conductive state. Then, only the memory cell selection line LY0 is deactivated (LY0=Low, LY1 to LYn=High), and the memory cell selection transistor Tcl0 of the phase change memory cell CL0 becomes a cutoff state, and the memory cell selection transistors Tcl1 to Tcln of the remaining memory cells CL1 to CLn become the conductive state.

Next, when the word line WL0 becomes High, and then, the bit line BL0 becomes Low, a current I0 flows from the word line WL0 to the bit line BL0 after passing through the chain selection transistor Tch2, the variable resistance storage element R0, the memory cell selection transistors Tcl1 to Tcln, and the chain selection transistor Tch1. The variable resistance storage element R0 becomes the high resistance as the current I0 is controlled in a form of a reset current pulse illustrated in FIG. 14. In addition, the variable resistance storage element R0 becomes the low resistance as the current I0 is controlled in a form of a set current pulse illustrated in FIG. 14. Data "1" and "0" are distinguished by a difference in resistance values of the variable resistance storage elements R0 to Rn.

In addition, it is possible to improve write speed by causing the current I0 to flow to the plurality of bit lines BL0_0, BL0_1 to BL0_m as illustrated in FIG. 4.

Although not particularly limited, it is configured in such a manner that the data "1" is recorded when the variable resistance storage element becomes the low resistance, and the data "0" is recorded when the variable resistance storage element becomes the high resistance.

Incidentally, the current is applied in the same path as that of the data write at a degree at which the resistance value of the variable resistance storage element R0 does not change in the case of reading the data recorded in the variable resistance storage element R0. In this case, a voltage value in response to the resistance value of the variable resistance storage element R0 is detected by the sense amplifier (in this example, SA0 in FIG. 4), and the data "0" and "1" are determined.

In addition, the data "0" and "1" are determined by the plurality of sense amplifiers (in this example, SA0 to SAm in FIG. 4) by applying the current in the same path as that of the data write at the degree at which the resistance value of the variable resistance storage element R0 does not change, through the plurality of bit lines BL0_0, BL0_1 to BL0_m as illustrated in FIG. 4, and thus, it is possible to improve read speed.

Figure 7:
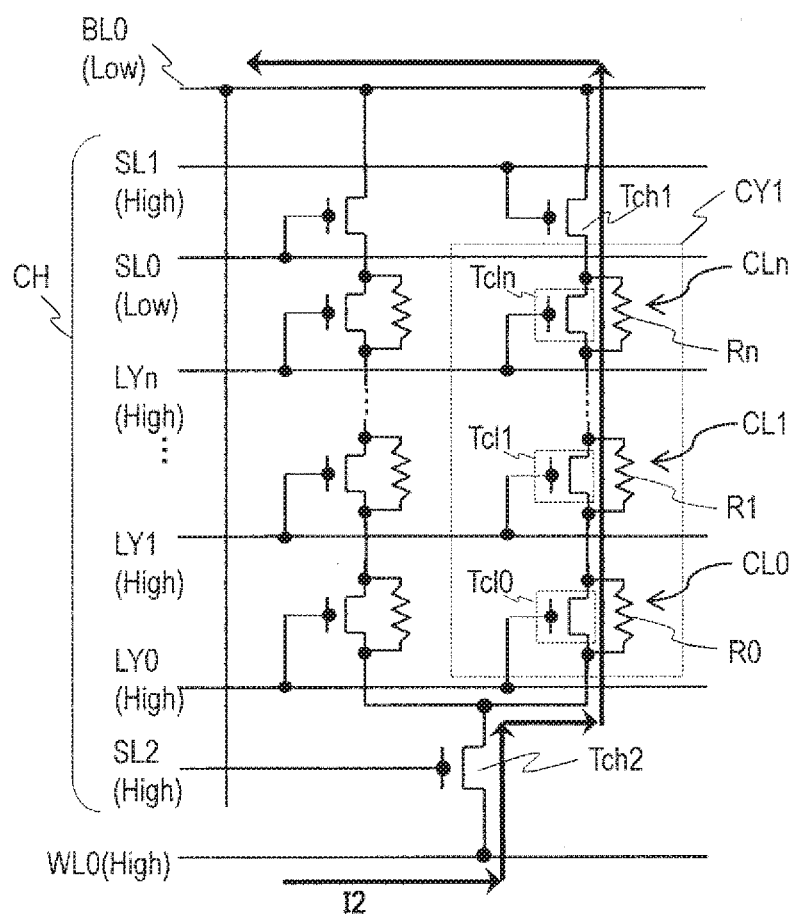
FIG. 7 is a circuit diagram illustrating another operation example of the chain memory array in FIG. 5.
Figure 8:
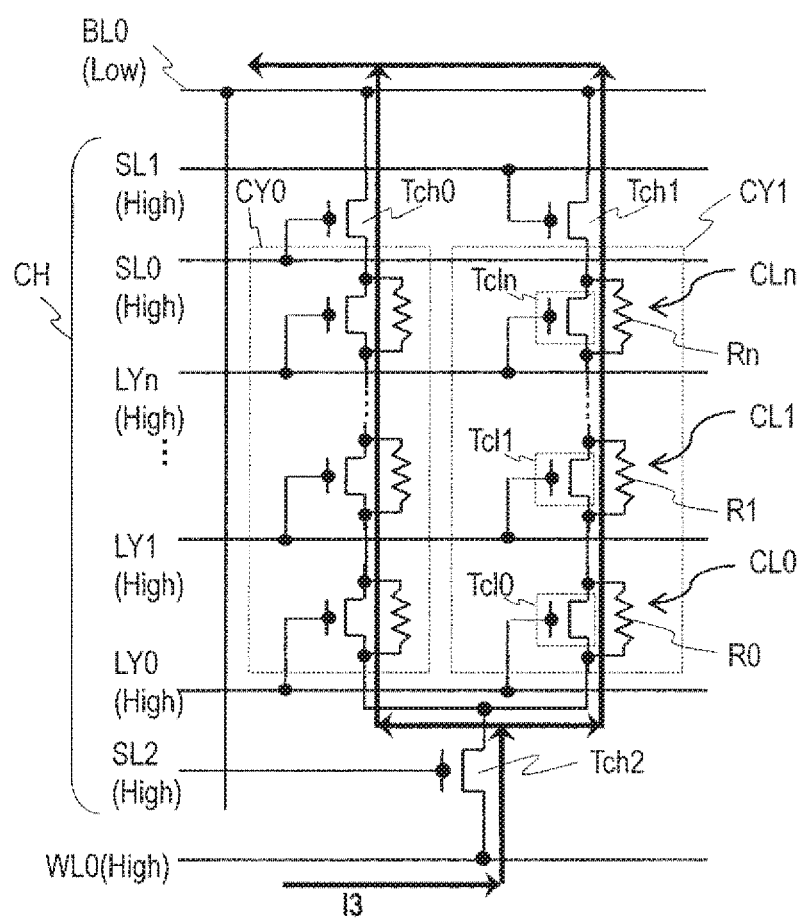
FIG. 8 is a circuit diagram illustrating another operation example of the chain memory array in FIG. 5.

FIGS. 7 and 8 are explanatory diagrams illustrating other operation examples of the chain memory array in FIG. 5.

A description will be given regarding an operation at the time of setting all the variable resistance storage elements R0 to Rn in the single chain memory array CY1 collectively to the low resistance, with reference to FIG. 7. Only the chain memory array selection line SL1 is activated (SL0=Low, SL1=High, SL2=High) by the chain decoder CHDEC, and the chain selection transistors Tch1 and Tch2 become the conductive state. Then, the memory cell selection lines LY0 to LYn are activated (LY0 to LYn=High), the memory cell selection transistors Tc10 to Tcln of the memory cells CL0 to CLn become the conductive state. Next, when the word line WL0 becomes High, and then, the bit line BL0 becomes Low, a current I2 flows from the word line WL0 to the bit line BL0 after passing through the chain selection transistor Tch2, the memory cell selection transistors Tc10 to Tcln, and the chain selection transistor Tch1. Joule heat generated by the current I2 is conducted to the variable resistance storage elements R0 to Rn, and the variable resistance storage elements R0 to Rn collectively become the low resistance. The current I2 is controlled to a value with which the variable resistance storage elements R0 to Rn can be collectively set to the low resistance.

A description will be given regarding an operation at the time of setting all the variable resistance storage elements R0 to Rn in the chain memory arrays CY0 and CY1 collectively to the low resistance, with reference to FIG. 8. The chain memory array selection lines SL0 and 1 are activated (SL0, SL1=High, SL2=High) by the chain decoder CHDEC, and the chain selection transistors Tch0, Tch1 and Tch2 of both the chain memory arrays CY0 and CY1 become the conductive state. Then, the memory cell selection lines LY0 to LYn are activated (LY0 to LYn=High), the memory cell selection transistors Tc10 to Tcln of the memory cells CL0 to CLn of both the chain memory arrays CY0 and CY1 become the conductive state. Next, when the word line WL0 becomes High, and then, the bit line BL0 becomes Low, a current I3 flows from the word line WL0 to the bit line BL0 after passing through the chain selection transistor Tch2, the memory cell selection transistors Tc10 to Tcln of both the chain memory arrays CY0 and CY1, and the chain selection transistors Tch0 and Tch1. Joule heat generated by the current I3 is conducted to the variable resistance storage elements R0 to Rn of both the chain memory arrays CY0 and CY1, and the variable resistance storage elements R0 to Rn collectively become the low resistance. A value of the current I3 is controlled to a value with which the variable resistance storage elements R0 to Rn of both the chain memory arrays CY0 and CY1 may be collectively set to the low resistance.

As described above, it is possible to set the memory cells in the plurality of chain memory arrays to the low resistance at the same time, if necessary, and it is possible to improve an erase data rate.

A description will be given regarding a dynamic block size change operation that is performed by the control device DYBS-CTL and the memory control circuit NVM-CTL with reference to FIGS. 9 to 12.

Figure 9:
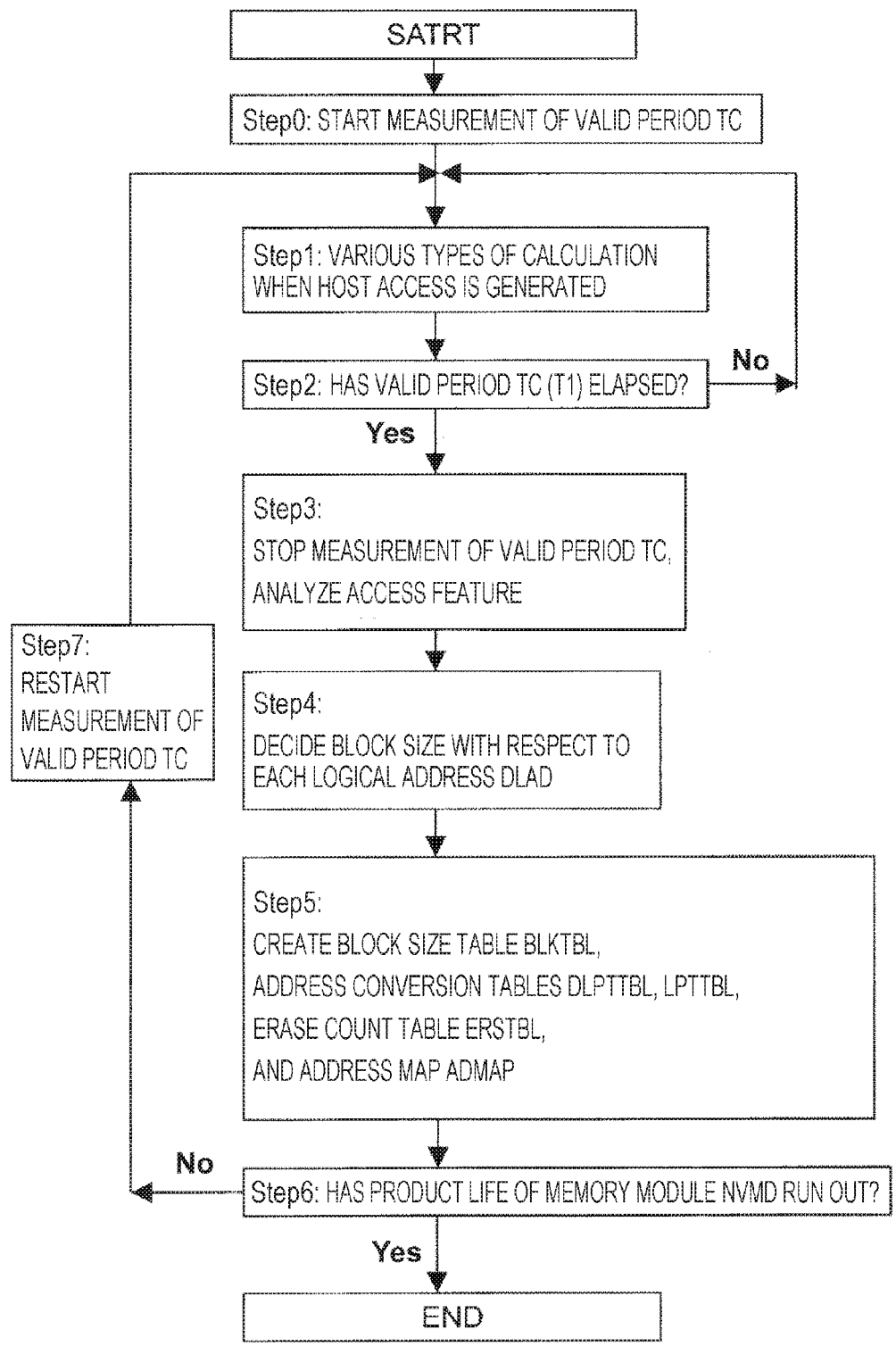
FIG. 9 is a flow diagram illustrating an entire flow of a dynamic block size change operation.
Figure 10:
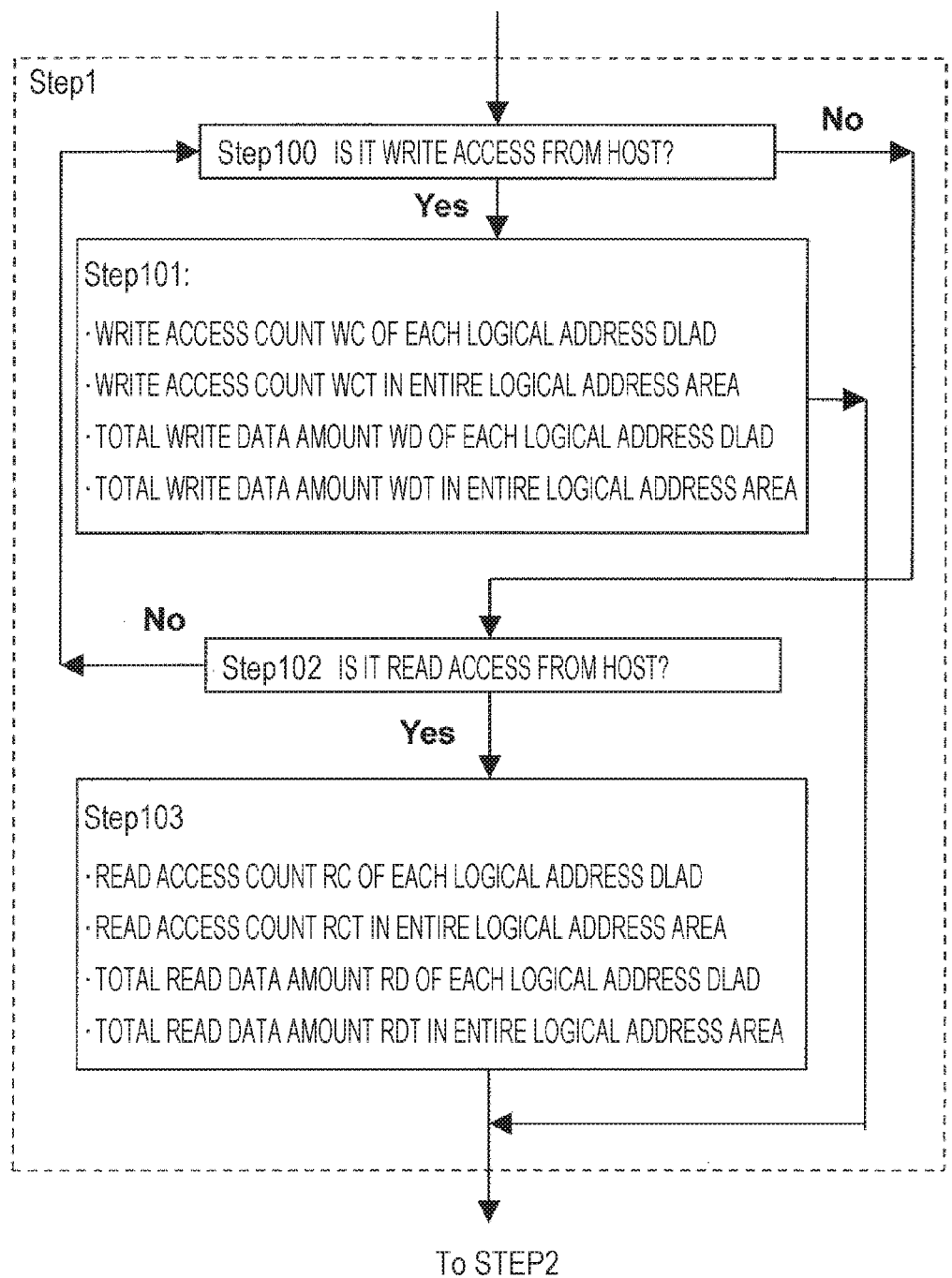
FIG. 10 is a flow diagram illustrating a detailed operation of Step 1 in FIG. 9.
Figure 11:
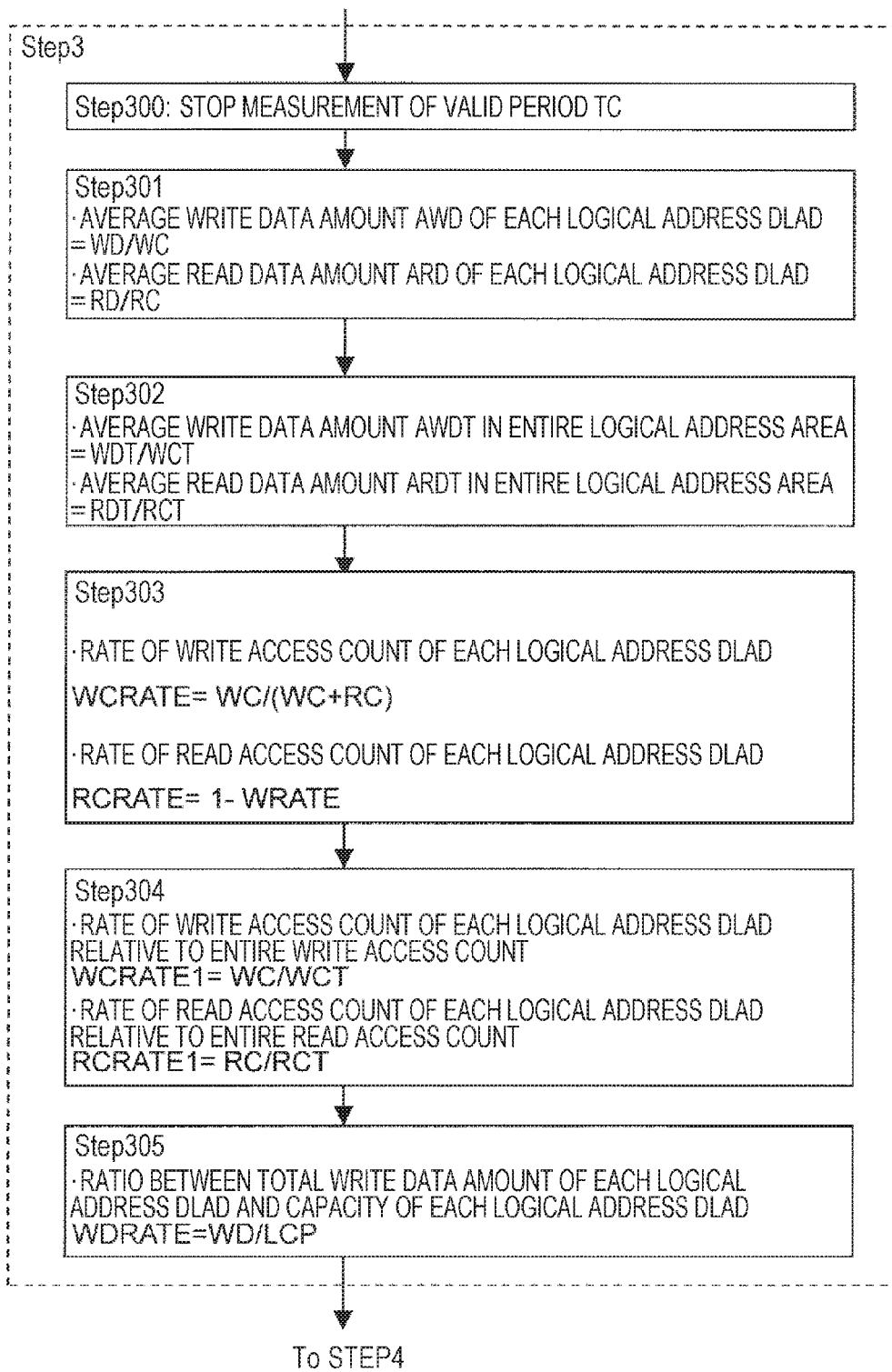
FIG. 11 is a flow diagram illustrating a detailed operation of Step 3 in FIG. 9.
Figure 12:
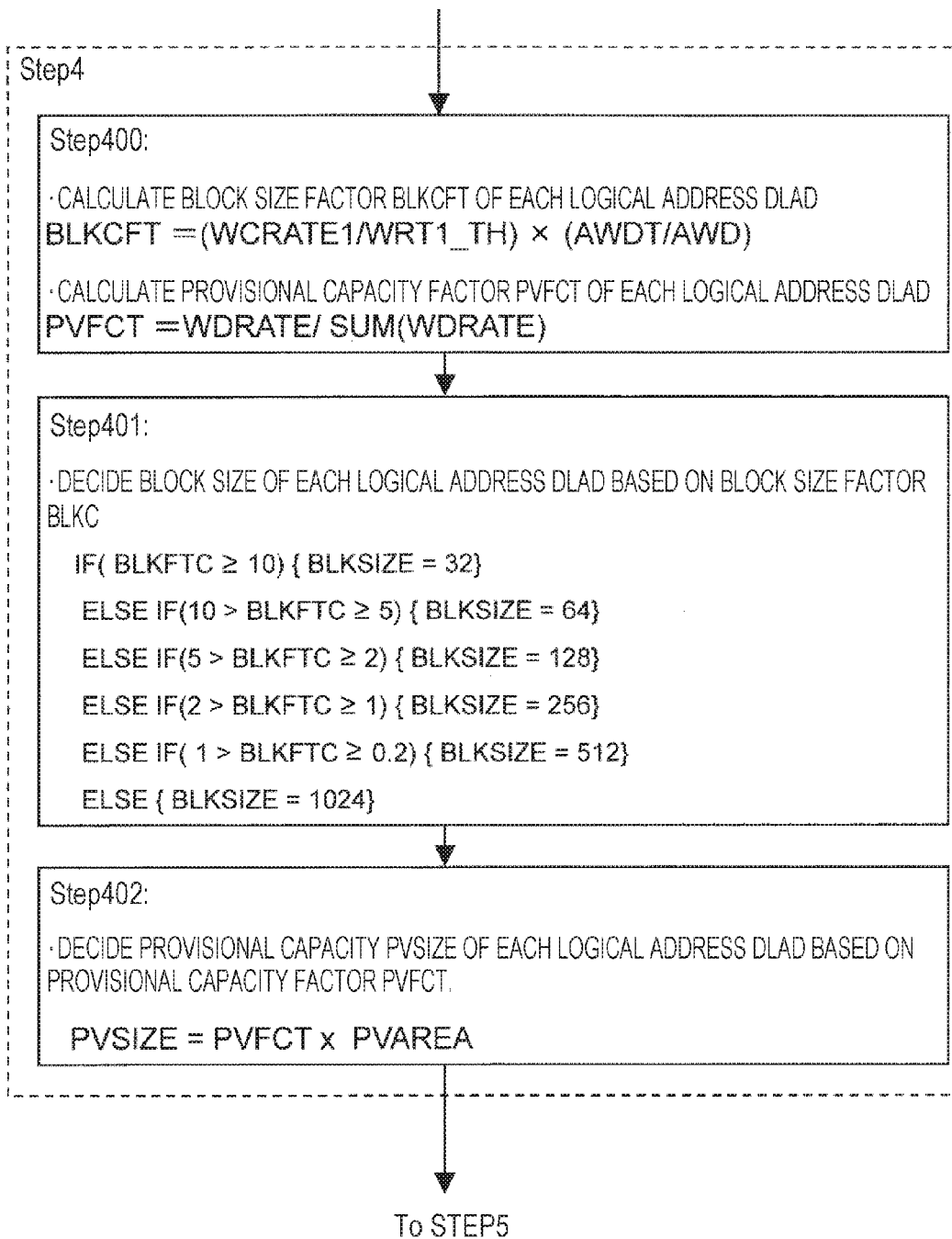
FIG. 12 is a flow diagram illustrating a detailed operation of Step 4 in FIG. 9.

FIG. 9 illustrates the entire flow of the dynamic block size change operation. In addition, FIGS. 10, 11 and 12 illustrate detailed operations of Steps 1, 3, and 4 in FIG. 9. FIGS. 13(A) to 14(B) illustrate the primary block size table BLK-TBL and the primary address conversion table DLPTBL.

In the flow of FIG. 9, measurement of a valid period TC is first started in Step 0. The valid period is a sampling period for analysis of a feature of access.

Next, Step 1 is executed when the read request (RQ) or the write request (WQ) is input from the information processing device CPUG to the control device DYBS-CTL via the router device ROUTER. Steps 100 to 103 are performed in Step 1.

In the flow of FIG. 10, whether the access from the host is write access is determined in Step 100. Step 101 is performed when the access is the write access, and Step 102 is performed when the access is not the write access. In Step 101, the following values are calculated.

a write access count WC of each of the logical addresses DLAD
   a write access count WCT in the entire logical address area
   a total write data amount WD of each of the logical addresses DLAD
   a total write data amount WDT in the entire logical address area Step 102 is performed when Step 101 is ended.

Whether the access from the host is read access is determined in Step 102. Step 103 is performed when the access is the read access, and Step 100 is performed when the access is not the read access. In Step 103, the following values are calculated.

a read access count RC of each of the logical addresses DLAD
   a read access count RCT of the entire logical address area
   a total read data amount RD of each of the logical addresses DLAD
   a total read data amount RDT of the entire logical address area Step 2 is performed when Step 103 is ended.

Returning to FIG. 9, whether the valid period IC of various types of calculation, executed in Steps 101 and 103 for the access feature analysis to be performed in Step 3, has passed a period T1 is checked in Step 2.

Step 3 is performed when the valid period T1 has elapsed, and Step 1 is performed when the valid period T1 has not elapsed.

In Step 3, the measurement of the valid period TC is stopped, and the feature of the access is analyzed using results from the various types of calculation in Step 1. Steps 300 to 305 are performed in Step 3.

In FIG. 11, first, the measurement of the valid period TC is once stopped in Step 300. In the next Step 301, the following values are calculated.

an average write data amount AWD per one-time write access of each of the logical addresses DLAD: AWD=the total write data amount WD of the logical address DLAD/a total write access count WC of the logical address DLAD an average read data amount ARD per one-time read access of each of the logical addresses DLAD: ARD=the total read data amount RD of the logical address DLAD/a total read access count RC of the logical address DLAD In the next Step 302, the following values are calculated.

an average write data amount AWDT per one-time write access in the entire logical address area: AWDT=the total write data amount WDT in the entire logical address area/a total write access count WCT in entire logical address area.

an average read data amount ARDT per one-time read access in the entire logical address area: ARDT=the total read data amount RDT in the entire logical address area/a total read access count RCT in entire logical address area.

In the next Step 303, the following values are calculated.

a rate WCRATE of a write access count of each of the logical addresses DLAD: WCRATE=WC/(WC+RC)

a rate RCRATE of a read access count of each of the logical addresses DLAD: RCRATE=RC/(WC+RC)=1−WRATE In the next Step 304, the following values are calculated.

a rate WRATE1 of the total write access count WC of the logical address DLAD relative to the total write access count WCT in the entire logical address area: WRATE1=WC/WCT a rate RRATE1 of the total read access count RC of the logical address DLAD relative to the total read access count RCT in the entire logical address area: RRATE1=RC/RCT In the next Step 305, the following values are calculated.

a ratio WDRATE between the total write data amount WD of each of the logical addresses DLAD and a capacity LCP of each of the logical addresses DLAD=WD/LCP In the flow of FIG. 11, features of both write and read are studied. The feature of write is that a copy amount of the garbage collection decreases in the case of performing access focusing on a small block as described above. On the other hand, the read performance is improved in the read access in which data is arranged to be dispersed in the nonvolatile memory. Accordingly, it is more desirable to consider both the features in order to obtain a performance balance.

The description will be continued returning to FIG. 9. Step 4 is performed after ending Step 3. In Step 4, a block size for each of the logical addresses DLAD is decided using the analysis result in Step 3. Steps 400 to 402 are performed in Step 4.

In Step 400 of FIG. 12, a block size factor BLKFCT and a provisional capacity factor (provisional area factor) PVFCT of each of the logical addresses DLAD are calculated.

The block size factor BLKFCT is represented by BLKFCT=(WCRATE1/WRT1AVG)×(AWDT/AWD).

A rate of capacity of each of the logical addresses DLAD relative to capacity of the entire logical address area is denoted by WRT1AVG. That is, the rate WRT1AVG is a rate of the write access count of each of the logical addresses DLAD in a case where the write access from the information processing device CPUG is performed averagely to each of the logical addresses DLAD. A rate of the write access count of each of the logical addresses DLAD is denoted by WCRATE1, and thus, a logical address having a large value of (WCRATE1/WRT1AVG) indicates that the access count is focused on the logical address above the average, that is, a hot area.

The average write data amount per one-time write access in the entire logical address area is denoted by AWDT, and the average write data amount per one-time write access of each of the logical addresses DLAD is denoted by AWD. Accordingly, a logical address having a large value of (AWDT/AWD) indicates that data to be written into the logical address per time is smaller than the average. As apparent from the above description, the block size factor BLKFCT is an indicator that has a large value when the write access with a small write data size per one-time write access is generated at a high frequency with respect to the logical address DLAD. As will be described in detail later, control to reduce a size of a physical address (erase block) associated with a logical address is performed when the logical address has a large value of BLKFCT in the present embodiment.

On the contrary, in the case of a logical address with which a large amount of write access with a large size per time is generated at the high frequency, the large-size block may be set to remain in order not to reduce an effective memory amount as an erase count increases.

In addition, the provisional capacity factor PVFCT is represented by PVFCT=WDRATE/SUM(WDRATE). Generally, the capacity of the physical address is set to be slightly larger than the capacity of the logical address. Such a margin (for example, about 20% or the like) is called a provisional area. It is possible to suppress depletion of an available area even in the case of performing rewrite of data by securing the provisional area. It is possible to adjust a rate of invalid data in the physical address (erase block) by changing this provisional area. A reason thereof is because the physical address generally has invalid data corresponding to the provisional area at the maximum since valid data of the physical address does not exceed the logical address capacity.

The ratio between the total write data amount WD of each of the logical addresses DLAD and the capacity LCP of each of the logical addresses DLAD is denoted by WDRATE, and the sum thereof is denoted by SUM(WDRATE). Accordingly, the provisional capacity factor PVFCT indicates any degree of the rate in which the logical address has been written. As will be described in detail later, control to increase the provisional area of the physical address (erase block) associated with a logical address is performed when the logical address has a large value of PVFCT in the present embodiment.

It is possible to increase the rate of the invalid data included in the erase block by increasing the provisional area. On the contrary, the physical address is excessively consumed when the provisional area is increased, and thus, the physical address that causes the increase of the provisional area is desirably limited to an area with a high rate of write (that is, the possibility that the amount of invalid data increases).

In the next Step 401, a block size BLKSIZE of each of the logical addresses DLAD is decided using the block size factor BLKFCT of each of the logical addresses DLAD.

The logical address DLAD having a large value of the block size factor BLKFCT indicates that a large amount of write access with a small write data size per one-time write access is generated at the high frequency in the corresponding logical address DLAD. Therefore, when a smaller block size is allocated to the logical address DLAD having the larger value of the block size factor BLKFCT, the number of physical pages that are valid in the block decreases, and the data copy amount accompanying the garbage collection operation performed inside the memory module NVMD decreases. Thus, a data copy time is shortened, and thus, a standby time of the read request RQ or the write request WQ from the control device DYBS-CTL is shortened, thereby improving the performance.

There is even a case where a large amount of write access is focused on a specific area at a significantly high frequency, and as an extreme example, there is no valid physical page in such an area. In such a case, the data copy itself is unnecessary, and the area is subjected only to erase. When the block size is appropriately selected, the case where the data copy itself is unnecessary as above increases, and it is possible to expect the improvement of performance.

Incidentally, a logical address area with a high access frequency is called the hot area, and data to be written to the hot area is also called hot data. In addition, a logical address area with a low access frequency is called a cold area, and data to be written to the cold area is also called cold data.

A determined value of the value of the block size factor BLKFCT has been given as an example and is not particularly limited. The block size BLKSIZE is decided by determination illustrated in the following example.

When the block size factor BLKFCT≥10, the block size BLKSIZE=32 KB.

When 10> the block size factor BLKFCT≥5, the block size BLKSIZE=64 KB.

When 5> the block size factor BLKFCT≥2, the block size BLKSIZE=128 KB.

When 2> the block size factor BLKFCT≥1, the block size BLKSIZE=256 KB.

When 1> the block size factor BLKFCT÷0.2, the block size BLKSIZE=512 KB.

When 0.2> the block size factor BLKFCT, the block size BLKSIZE=1024 KB.

In the next Step 402, a provisional capacity PVSIZE of each of the logical addresses DLAD is decided using a provisional capacity factor PVFCT of each of the logical addresses DLAD.

The logical address DLAD having a large value of the provisional capacity factor PVFCT indicates that the write data amount thereof is large. Therefore, it is necessary to increase capacity, to be allocated to the logical address DLAD, in a provisional area total capacity PVAREA in the logical address DLAD having a large value of the provisional capacity factor PVFCT so as to increase the product life of the memory module NVMD in the case of allocating the physical address DPAD of the nonvolatile memory having an upper limit of a rewrite count to the logical address DLAD since the product life of the memory module NVMD decides the product life of the information processing system.

Thus, the provisional capacity PVSIZE can be represented by PVSIZE=PVFCT× the provisional area total capacity PVAREA.

In the next Step 5 of FIG. 9, the control device DYBS-CTL creates the primary block size table BLKTBL1 indicating the block size and the primary address conversion table DLPTBL1 using the block size BLKSIZE and the provisional capacity PVSIZE obtained in Step 4.

Further, after the control devices DYBS-CTL0 to m create the primary block size table BLKTBL1 and the primary address conversion table DLPTBL1, the control device DYBS-CTL transmits the primary block size table BLKTBL1 and the primary address conversion table DLPTBL1 to the memory control circuit NVM-CTL and instructs the memory control circuit NVM-CTL to newly create the secondary address conversion table DLPTBL2, the erase count table ERSTBL for each block, and the address map ADMAP.

According to the instruction of the control device DYBS-CTL, the memory control circuit NVM-CTL creates the secondary address conversion table DLPTBL2, the erase count table ERSTBL for each block, and the address map ADMAP based on the information of the primary block size table BLKTBL1 and the primary address conversion table DLPTBL1.

In the next Step 6, the control device DYBS-CTL checks whether the memory module NVMD reaches the product life.

Step 7 is performed when the memory module NVMD does not reach the product life. When the memory module NVMD reaches the product life, the memory control circuit NVM-CTL ends the dynamic block size change operation.

In Step 7, the measurement of the valid period TC is restarted.

FIGS. 13(A) and 13(B) illustrate the primary block size table BLKTBL1 and the primary address conversion table DLPTBL1, which are associated with each set of the 64 logical addresses DLAD that is created by the control device DYBS-CTL for the first time (that is, after ending of the measurement and analysis of the valid period TC(T1) at the first time in FIG. 9).

FIGS. 14(A) and 14(B) illustrate the primary block size table BLKTBL1 and the primary address conversion table DLPTBL1, which are associated with each set of the 64 logical addresses DLAD that is created by the control device DYBS-CTL at the second time (that is, after ending of the measurement and analysis of the valid period TC(T2) at the second time in FIG. 9).

The block size table represents an access feature with respect to each logical address and a physical block specification based on the access feature. As described above, the logical address is denoted by DLAD, the rate of the write access count is denoted by WCRATE1, the average write data amount per the one-time write access of the logical address is denoted by AWD, the ratio between the total write data amount WD of each of the logical addresses DLAD and the capacity LCP of each of the logical addresses DLAD is denoted by WDRATE in the block size table.

The block size factor is denoted by BLKFCT, and the logical address DLAD having the large value of the block size factor BLKFCT indicates that the write address with the small write data size per one-time write access is generated at the high frequency in the corresponding logical address DLAD. The block size of the logical address DLAD is denoted by BLKSIZE, and the provisional capacity factor is denoted by PVFCT. The logical address DLAD having the large value of the provisional capacity factor PVFCT indicates that the write data amount thereof is large. The provisional capacity is denoted by PVSIZE.

A rate of capacity of each of the logical addresses DLAD relative to capacity of the entire logical address area is denoted by WRT1AVG, and the average write data amount per one-time write access in the entire logical address area is denoted by AWDT, and the provisional area total capacity is denoted by PVAREA.

The address conversion table shows the allocation of the physical address with respect to the logical address based on the block size table. In the address conversion table, the physical address of the memory module associated with the logical address DLAD is denoted by DPAD, the capacity of the physical address is denoted by DPADSIZE, and the physical address allocated to the provisional area is denoted by PRAREA. With reference to the block size table BLKTBL of FIG. 13(A), a value of the block size factor BLKFCT is a high value of 8.28 in the logical addresses DLAD0 to 63, since a large amount of write access with the small write data size per one-time write access is generated at the high frequency.

Thus, the block size BLKSIZE in the logical addresses DLAD0 to 63 is 64 KB which is relatively small.

On the contrary, a value of the block size factor BLKFCT is a low value of 0.03 in the logical addresses DLAD448 to 511, since a small amount of write access with large write data size per one-time write access is generated at the low frequency. Thus, the block size BLKSIZE in the logical addresses DLAD448 to 511 is 1024 KB which is relatively large.

In addition, the write data amount to the logical addresses DLAD0 to 63 is large, a value of the provisional capacity factor PVFCT indicates the highest value of 0.25. Thus, the provisional capacity PVSIZE of the logical addresses DLAD0 to 63 is the highest value of 32.

On the contrary, the write data amount to the logical addresses DLAD448 to 511 is small, a value of the provisional capacity factor PVFCT indicates the lowest value of 0.055. Thus, the provisional capacity PVSIZE of the logical addresses DLAD448 to 511 is the lowest value of 7.

With reference to the address conversion table DLPTBL of FIG. 13(B), the physical addresses DPAD allocated to the logical addresses DLAD0 to 63 are DPDA0 to 63 and DPAD512 to 543.

That is, the capacity DPADSIZE of the physical address DPAD allocated to the logical addresses DLAD0 to 63 is the largest value of 96. This is because the value of the provisional capacity PVSIZE of the logical addresses DLAD0 to 63, that is, 32 is added to the capacity value of 64 up to the logical addresses DLAD0 to 64.

The physical addresses DPAD allocated to the logical addresses DLAD448 to 511 are DPDA448 to 511 and DPAD631 to 639.

That is, the capacity DPADSIZE of the physical address DPAD allocated to the logical addresses DLAD448 to 511 is the smallest value of 71. This is because the value of the provisional capacity PVSIZE of the logical addresses DLAD448 to 511, that is, 7 is added to the capacity value of 64 up to the logical addresses DLAD448 to 511.

With reference to the block size table BLKTBL of FIG. 14(A), a value of the block size factor BLKFCT of the logical addresses DLAD0 to 63 is a high value of 11.04. Thus, the block size BLKSIZE in the logical addresses DLAD0 to 63 is 32 KB.

That is, this value of the block size factor BLKFCT is a higher value than the block size factor BLKFCT of the logical addresses DLAD0 to 63 in the block size table BLKTBL created by the control device DYBS-CTL for the first time. This indicates that a large amount of write access having the small write data size per one-time write access with respect to the logical addresses DLAD0 to 63 is generated at a higher frequency.

The control device DYBS-CTL extracts the feature of the write access for each of the logical addresses DLAD and changes the block size BLKSIZE in the logical addresses DLAD0 to 63 from 64 KB to 32 KB.

In addition, a value of the block size factor BLKFCT in the logical addresses DLAD192 to 255 is a low value of 0.58. Thus, the block size BLKSIZE in the logical addresses DLAD192 to 255 is 512 KB.

That is, this value of the block size factor BLKFCT is a lower value than the block size factor BLKFCT of the logical addresses DLAD192 to 255 in the block size table BLKTBL created by the control device DYBS-CTL at the first time. This indicates that the write access having the large write data size per one-time write access with respect to the logical addresses DLAD192 to 255 is generated at a lower frequency.

The control device DYBS-CTL extracts the feature of the write access for each of the logical addresses DLAD and changes the block size BLKSIZE in the logical addresses DLAD192 to 255 from 256 KB to 512 KB.

With reference to the address conversion table DLPTBL of FIG. 14(B), the physical addresses DPAD allocated to the logical addresses DLAD0 to 63 are DPDA0 to 63 and DPAD512 to 564.

That is, the capacity DPADSIZE of the physical address DPAD allocated to the logical addresses DLAD0 to 63 is 117.

This is because the provisional capacity PVSIZE thereof is 53 which is a higher value than the provisional capacity PVSIZE of the logical addresses DLAD0 to 63 in the address conversion table DLPTBL created by the control device DYBS-CTL at the first time.

At this time, the control device DYBS-CTL calculates the write data amount for each of the logical addresses DLAD, and increases the capacity DPADSIZE of the physical address DPAD to be allocated to the logical addresses DLAD0 to 63 from 96 to 117.

In addition, the physical addresses DPAD allocated to the logical addresses DLAD192 to 255 are DPDA192 to 255 and DPAD611 to 621.

That is, the capacity DPADSIZE of the physical address DPAD allocated to the logical addresses DLAD192 to 255 is 75.

This is because the provisional capacity PVSIZE thereof is 11 which is a lower value than the provisional capacity PVSIZE of the logical addresses DLAD192 to 255 in the address conversion table DLPTBL created by the control device DYBS-CTL at the first time.

At this time, the control device DYBS-CTL calculates the write data amount for each of the logical addresses DLAD, and decreases the capacity DPADSIZE of the physical address DPAD to be allocated to the logical addresses DLAD192 to 255 from 18 to 11.

As described above the control device DYBS-CTL performs the control based on the block size table and the address conversion table, thereby setting the size of the erase block of the memory array and the provisional area. In a nonvolatile memory having a three-dimensional structure disclosed in PTL 3, a method of collectively erasing data stored in an array of N×M memory cells having a three-dimensional structure. The values of N and M can be decided depending on any memory cell array to be selected. In addition, it is disclosed that a thermal buffer area is provided such that the Joule heat in an erase operation does not give a great influence to a crystalline state of peripheral memory cells, adjacent to a memory cell array as an erase target. However, data is not written into this thermal buffer area, and thus, a proportion of the thermal buffer area increases as an erase data unit is decreased, and accordingly, effective memory capacity decreases. That is, there is an effect that the amount of valid data inside a block decreases by evenly decreasing sizes of blocks, but the proportion of the thermal buffer area increase when the thermal buffer area is arranged at boundary portions of blocks, and effective data capacity decreases. In this manner, performance of an SSD and the effective memory capacity has a trade-off relationship in the nonvolatile memory device of the related art.

Accordingly, the configuration of the present embodiment that changes the block size as necessary is advantageous.

Figure 15:
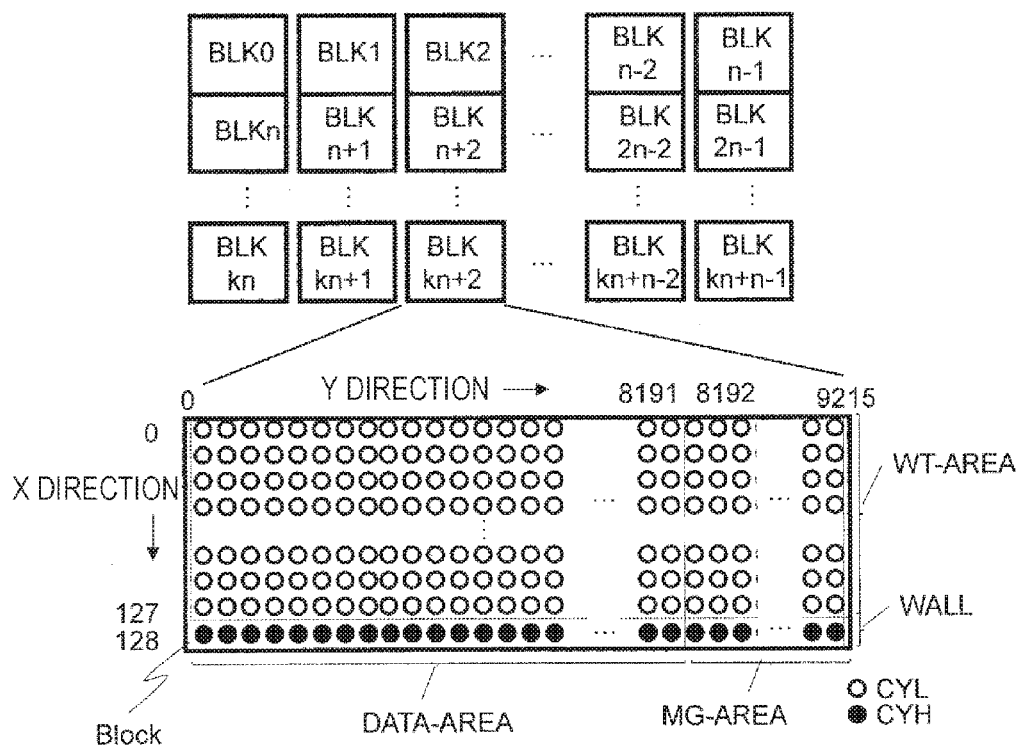
FIG. 15 is a top view illustrating an example of a block configuration of a memory array of a nonvolatile memory.

FIG. 15 is an example of a block configuration of the memory array of the nonvolatile memory device NMV to be constructed using the information of the address map ADMAP created by the memory control circuit NVM-CTL based on the information of the block size table BLKTBL transmitted from the control device DYBS-CTL to the memory control circuit NVM-CTL, and an example of a block configuration in which the block size is 1024 KB.

One block is configured using chain memory arrays of 129 (X-direction: X-BLK)×9216 (Y-direction: Y-BLK)×8 (Z-direction: Z-BLK), and it is illustrated that a size thereof is 11888864 bytes (=129 (X-direction)×9216 (Y-direction)×8 (Z-direction)).

In addition, the memory arrays of 8 (X-direction: XERS)×72 (Y-direction: YERS)×8 (Z-direction: ZERS) collectively become the low resistance as the erase data unit, and an erase data size thereof is 576 bytes (=9 (X-direction)×72 (Y-direction)×8 (Z-direction)).

In addition, a memory array corresponding to one row in the X-direction, that is, the memory array of 1 (X-direction: XWAL)×9216 (Y-direction)×8 (Z-direction) is set as a thermal buffer area WALL, and it is illustrated that a size thereof is 9216 bytes (=1 (X-direction)×9216 (Y-direction)×8 (Z-direction)).

The nonvolatile memory device is configured of the blocks BLK0 to BLKkn+n−1, and an example of arrangement of a chain memory array CYL of a memory array ARY in each of the blocks and a chain memory array CYH is illustrated. In the drawing, the chain memory array CYL is indicated using a white circle, and the chain memory array CYH forming the thermal buffer area is indicated using a black circle. In the below drawings, the chain memory array CYL and the chain memory array CYH are displayed in the same method.

In FIG. 15, one block is configured using chain memory arrays of 129 (X-direction)×9216 (Y-direction), and a size thereof is 11888864 bytes (=129 (X-direction)×9216 (Y-direction)×8 (Z-direction)). A plurality of this blocks are arranged to form the memory array of the nonvolatile memory illustrated in FIG. 4.

A write area WT-AREA inside one block is a region that is formed as a plurality of chain memory arrays CYL are physically collected, which is the same in the erase area.

A size of the write area WT-AREA is 1179648 bytes (=128 (X-direction)×9216 (Y-direction)×8 (Z-direction)).

A size of a data area DATA-AREA inside the write area WT-AREA is 1048576 bytes (=128 (X-direction)×8192 (Y-direction)×8 (Z-direction)), and a size of a management area MG-AREA inside the write area WT-AREA is 131072 bytes (=128 (X-direction)×1024 (Y-direction)×8 (Z-direction)).

A data size of the single logical address LAD is 8192 bytes, and the information processing circuit CONTL generates an ECC code with respect to this data DATA, and writes the data DATA and the ECC code to the write area WT-AREA inside the block of the memory array of the nonvolatile memory.

In addition, the data area DATA-AREA of 8192 bytes to write the data DATA for the single logical address LAD and the management area MG-AREA of 1024 bytes to write the ECC code and the like with respect to the data DATA are allocated to one physical address, and thus, data of the physical addresses with respect to the 128 logical addresses LAD is stored in the write area WT-AREA of 1048576 bytes.

In addition, the thermal buffer area WALL is a region that is formed as the plurality of chain memory arrays CYH, arranged at an outer side of the write area WT-AREA, are physically collected.

In FIG. 15, a size of the thermal buffer area WALL is 9216 bytes (=1 (X-direction)×9216 (Y-direction)×8 (Z-direction)).

In addition, the data of the entire memory cell included in the entire chain memory array CYL inside the write area WT-AREA (=the erase area) first becomes "1" (a set state: a low resistance state) That is, the data is collectively erased, and then, only data "0" (a reset state: a high resistance state) is written for each of the physical addresses PAD. For example, when a size of the write area WT-AREA is 1179648 bytes, and a size of data collectively erased by one-time erase operation is 576 bytes, 2048 times of erase operations are sequentially performed in a direction parallel to the Y-direction, and data of the entire memory cell of the write area WT-AREA becomes "1" (the set state: the low resistance state).

The erase operation is not performed for the thermal buffer area WALL, and thus, the deterioration of reliability caused by thermal disturbance at the time of performing the erase operation to the write area does not affect an adjacent block. Further, the data of "0" (the reset state: the high resistance state) is not written into the thermal buffer area WALL. The memory array CYH serving as the thermal buffer area is structurally a general memory cell, but is controlled so as not to be subjected to write or erase by the control device.

At this time, it is possible to prevent the deterioration of reliability caused by the thermal disturbance by arranging the chain memory array CYH in the periphery of the write area (=the erase area) as the thermal buffer area WALL.

Incidentally, the thermal buffer area WALL is not formed in the X-direction in FIG. 15. In this embodiment, the thermal buffer area WALL is unnecessary, and thus, is not formed in the X-direction since an interval is physically provided in the Y-direction between the blocks BLK as a device structure. However, the thermal buffer area may be also provided in the X-direction if necessary.

Figure 16:
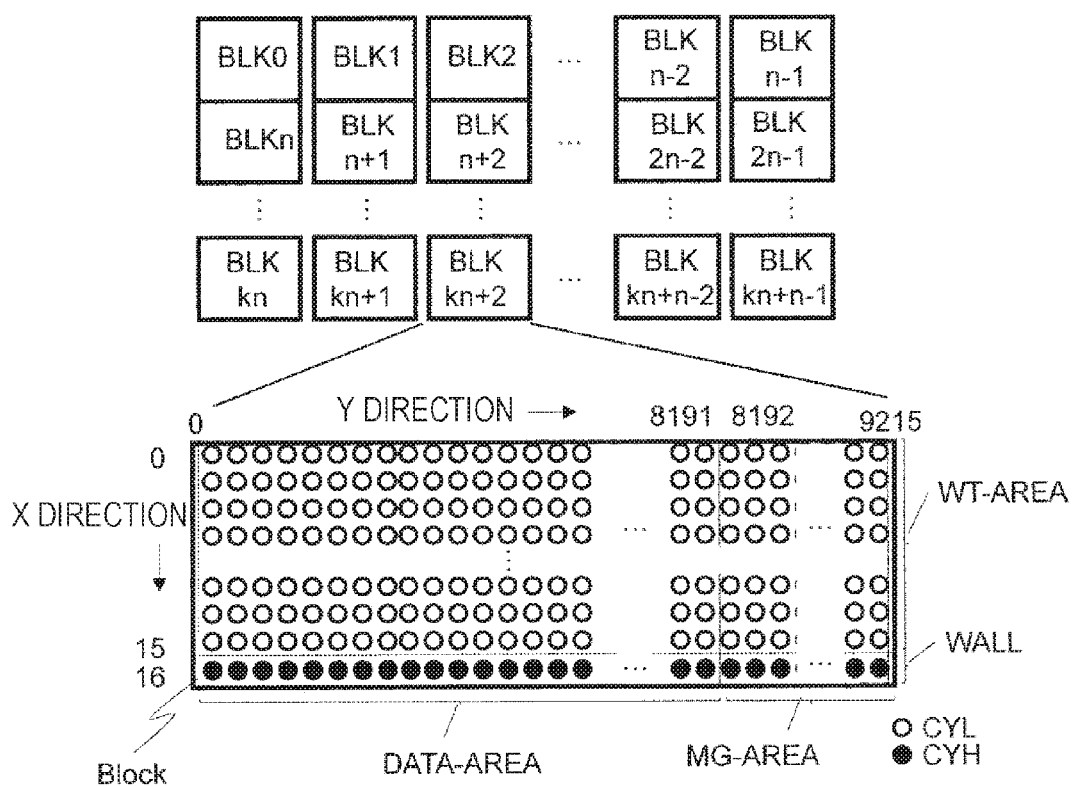
FIG. 16 is a top view illustrating an example of the block configuration of the memory array of the nonvolatile memory.

FIG. 16 is an example of a block configuration of the memory array of the nonvolatile memory device NMV to be constructed using the information of the address map ADMAP created by the memory control circuit NVM-CTL based on the information of the block size table BLKTBL transmitted from the control device DYBS-CTL to the memory control circuit NVM-CTL, and an example of a block configuration in which the block size is 128 KB.

One block is configured using the chain memory arrays of (X-direction: X-BLK)×9216 (Y-direction: Y-BLK)×8 (Z-direction: Z-BLK), and a size thereof is 156672 bytes (=17 (X-direction)×9216 (Y-direction)×8 (Z-direction)).

In addition, the erase data unit and the thermal buffer area WALL are set to be the same as those of FIG. 15. The display method of the chain memory array CYL and the chain memory array CYH is the same as that of FIG. 15.

In FIG. 16, one block is configured using the chain memory arrays of 17 (X-direction)×9216 (Y-direction), and a size thereof is 156672 bytes (=17 (X-direction)×9216 (Y-direction)×8 (Z-direction)). A plurality of this blocks are arranged to form the memory array of the nonvolatile memory illustrated in FIG. 4.

The write area WT-AREA inside one block is a region that is formed as the plurality of chain memory arrays CYL are physically collected, which is the same in the erase area.

A size of the write area WT-AREA is 147456 bytes (=16 (X-direction)×9216 (Y-direction)×8 (Z-direction)).

A size of a data area DATA-AREA inside the write area WT-AREA is 131072 bytes (=16 (X-direction)×8192 (Y-direction)×8 (Z-direction)), and a size of a management area MG-AREA inside the write area WT-AREA is 16384 bytes (=16 (X-direction)×1024 (Y-direction)×8 (Z-direction)).

The writing method and erasing method with respect to the memory array of the nonvolatile memory using the information processing circuit CONTL are the same as those of FIG. 15.

Figure 17:
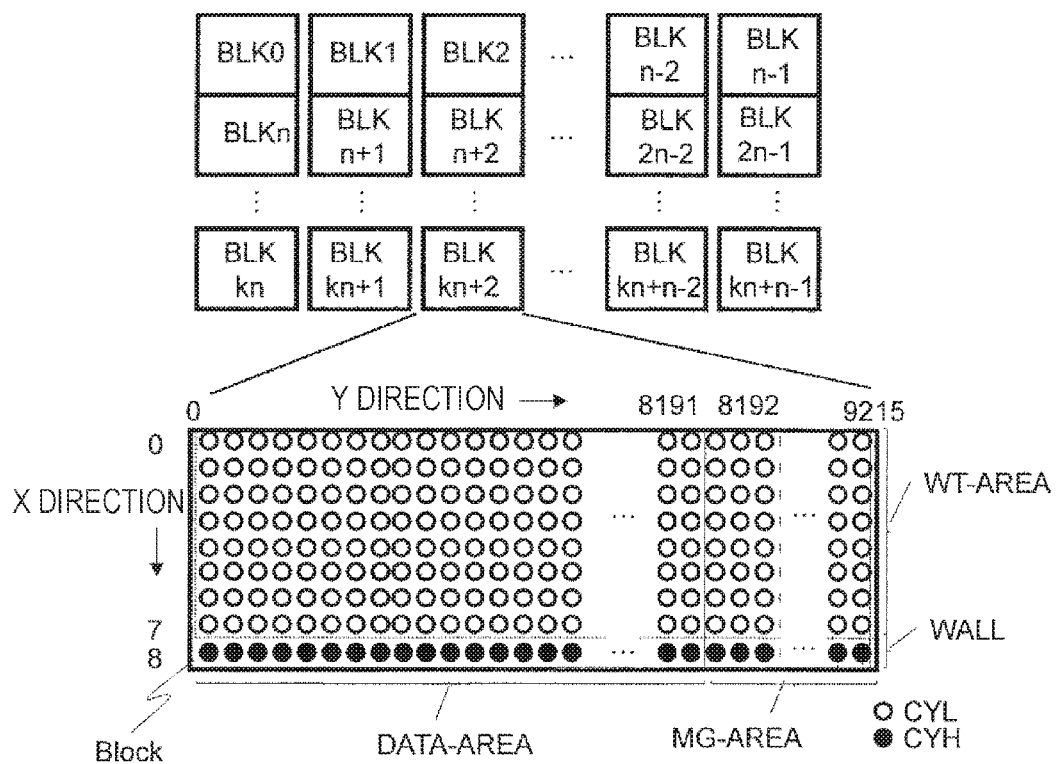
FIG. 17 is a top view illustrating an example of the block configuration of the memory array of the nonvolatile memory.

FIG. 17 is an example of a block configuration of the memory array of the nonvolatile memory device NMV to be constructed using the information of the address map ADMAP created by the memory control circuit NVM-CTL based on the information of the block size table BLKTBL transmitted from the control device DYBS-CTL to the memory control circuit NVM-CTL, and an example of a block configuration in which the block size is 64 KB.

One block is configured using the chain memory arrays of 9 (X-direction: X-BLK)×9216 (Y-direction: Y-BLK)×8 (Z-direction: Z-BLK), and a size thereof is 82944 bytes (=9 (X-direction)×9216 (Y-direction)×8 (Z-direction)).

In addition, the erase data unit and the thermal buffer area WALL are set to be the same as those of FIG. 15. The display method of the chain memory array CYL and the chain memory array CYH is the same as that of FIG. 15.

In FIG. 17, one block is configured using the chain memory arrays of 9 (X-direction)×9216 (Y-direction), and a size thereof is 82944 bytes (=9 (X-direction)×9216 (Y-direction)×8 (Z-direction)). A plurality of this blocks are arranged to form the memory array of the nonvolatile memory illustrated in FIG. 4.

A write area WT-AREA inside one block is a region that is formed as a plurality of chain memory arrays CYL are physically collected, which is the same in the erase area.

A size of the write area WT-AREA is 73728 bytes (=8 (X-direction)×9216 (Y-direction)×8 (Z-direction)).

A size of a data area DATA-AREA inside the write area WT-AREA is 65536 bytes (=8 (X-direction)×8192 (Y-direction)×8 (Z-direction)), and a size of a management area MG-AREA inside the write area WT-AREA is 8192 bytes (=8 (X-direction)×1024 (Y-direction)×8 (Z-direction)).

The writing method and erasing method with respect to the memory array of the nonvolatile memory using the information processing circuit CONTL are the same as those of FIG. 15.

Figure 18:
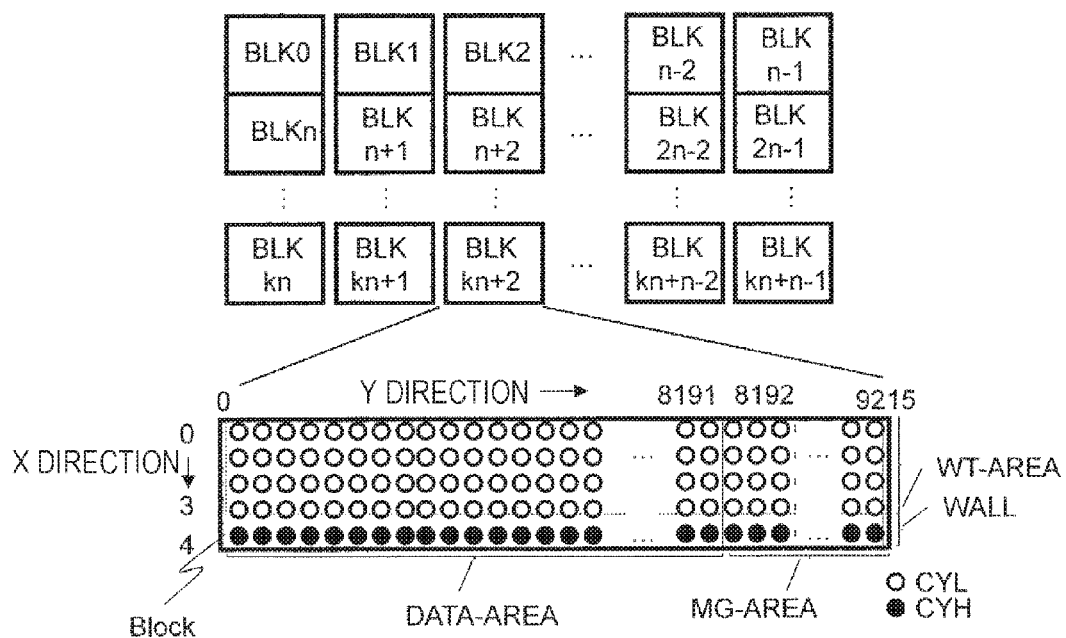
FIG. 18 is a top view illustrating an example of the block configuration of the memory array of the nonvolatile memory.
Figure 19:
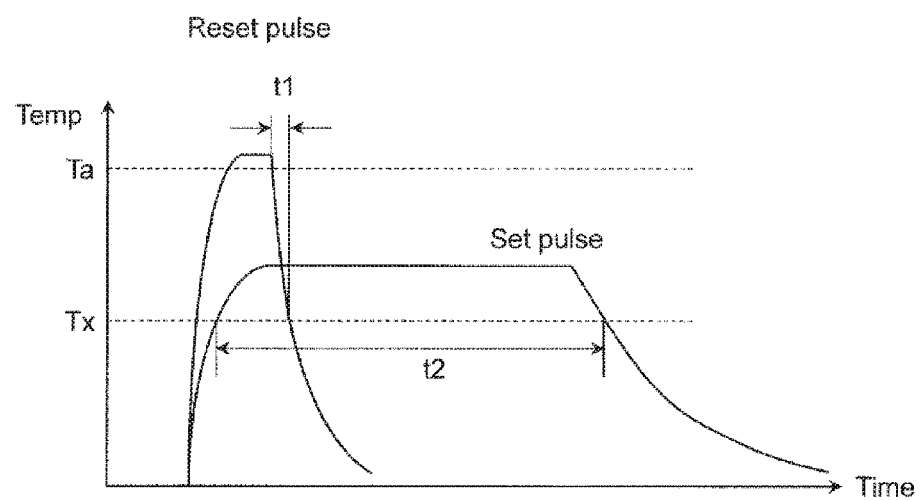
FIG. 19 is a graph illustrating a relationship between a pulse width and temperature necessary for a phase change of a resistive storage element using a phase change material.

FIG. 18 is an example of a block configuration of the memory array of the nonvolatile memory device NMV to be constructed using the information of the address map ADMAP created by the memory control circuit NVM-CTL based on the information of the block size table BLKTBL transmitted from the control device DYBS-CTL to the memory control circuit NVM-CTL, and an example of a block configuration in which the block size is 32 KB.

One block is configured using the chain memory arrays of 5 (X-direction: X-BLK)×9216 (Y-direction: Y-BLK)×8 (Z-direction: Z-BLK), and a size thereof is 46080 bytes (=5 (X-direction)×9216 (Y-direction)×8 (Z-direction)).

In addition, the erase data unit and the thermal buffer area WALL are set to be the same as those of FIG. 15. The display method of the chain memory array CYL and the chain memory array CYH is the same as that of FIG. 15.

In FIG. 18, one block is configured using the chain memory arrays of 5 (X-direction)×9216 (Y-direction), and a size thereof is 46080 bytes (=9 (X-direction)×9216 (Y-direction)×8 (Z-direction)). A plurality of this blocks are arranged to form the memory array of the nonvolatile memory illustrated in FIG. 4.

A write area WT-AREA inside one block is a region that is formed as a plurality of chain memory arrays CYL are physically collected, which is the same in the erase area.

A size of the write area WT-AREA is 36864 bytes (=4 (X-direction)×9216 (Y-direction)×8 (Z-direction)).

A size of a data area DATA-AREA inside the write area WT-AREA is 32768 bytes (=8 (X-direction)×8192 (Y-direction)×8 (Z-direction)), and a size of a management area MG-AREA inside the write area WT-AREA is 8192 bytes (=8 (X-direction)×1024 (Y-direction)×8 (Z-direction)).

The writing method and erasing method with respect to the memory array of the nonvolatile memory using the information processing circuit CONTL are the same as those of FIG. 15.

As described in FIGS. 15 to 18, the memory control circuit NVM-CTL can optimally configure the block size of the memory array of the nonvolatile memory illustrated in FIG. 4 based on the information of the block size table BLKTBL, and it is possible to suppress the proportion of the thermal buffer area with respect to the capacity of the nonvolatile memory and to realize the cost reduction and the increase in performance of the memory module MD.

Although a width in the X-direction is changed without changing a width in the Y-direction at the time of changing the block size in FIGS. 15 to 18, a method of changing the size is not limited thereto, and the width in the Y-direction may be changed. However, a change of a position of the memory arrays CYH arranged in the Y-direction is enough in order to change a boundary of the blocks arranged in the X-direction in the method of FIGS. 15 to 18, and thus, the control thereof is simple. In addition, there is also the advantage that the setting of the thermal buffer area is unnecessary since the physical interval according to the device structure is used as the boundary of the blocks arranged in the Y-direction.

Incidentally, the thermal buffer area is not necessarily provided in a device structure in which the influence of the thermal buffer can be ignored.

SUMMARY

The main effects that can be obtained by the respective embodiments described above are as follow.

First, it is possible to optimally change the block size of the logical address by extracting each feature amount of the write and read requests generated for each of the logical addresses, and to improve the data transmission performance of the semiconductor device.

Second, it is possible to optimize the capacity of the physical address area with respect to each of the logical address areas by extracting the feature amount of the write request caused for each of the logical addresses, and to improve the reliability of the semiconductor device.

Third, it is possible to optimally change the block size of the logical address by extracting each feature amount of the write and read requests generated for each of the logical addresses, to suppress the proportion of the thermal buffer area relative to the nonvolatile memory the capacity, and to implement cost reduction of the semiconductor device.

Although the description has been given in detail regarding the invention made by the present inventor based on the embodiments as above, the present invention is not limited to the embodiments, and, of course, can be modified in various ways within a scope not departing from a gist thereof. For example, the above-described embodiments have been described in detail in order to describe the present invention in an easily understandable manner, and are not necessarily limited to one including the entire configuration that has been described above. In addition, some configurations of a certain embodiment can be substituted by configurations of another embodiment, and further, a configuration of another embodiment can be added to a configuration of a certain embodiment. In addition, addition, deletion or substitution of other configurations can be made with respect to some configurations of each embodiment. In addition, the description has been given mainly using the phase change memory as the representative in the embodiment, but it is possible to obtain the same effect by applying any resistance change memory including a ReRAM and the like in the same manner.

In addition, the description has been given using the memory having the three-dimensional structure in which the plurality of memory cells are arranged to be sequentially stacked in the height direction with respect to the semiconductor substrate as the representative. However, it is possible to obtain the same effect by applying a memory having a two-dimensional structure in which a single memory cell is arranged in the height direction with respect to the semiconductor substrate in the same manner.

INDUSTRIAL APPLICABILITY

The invention can be used in a technical field of a storage device using the nonvolatile memory.

REFERENCE SIGNS LIST

ADCMDIF address-command interface circuit
ARB arbitration circuit
ARY memory array
BK memory bank
BL bit line
BSW bit line selection circuit
BUF buffer
CADLT column address latch
CH chain control line
CHDEC chain decoder
CHLT chain selection address latch
CL phase change memory cell
COLDEC column decoder
PAD physical address
CPAD physical address
CPUG information processing device
CTLOG control circuit
CY chain memory array
DATCTL data control circuit
DBUF data buffer
DSW data selection circuit
DT data line
ENUM entry number
HDH_IF interface signal
HOST_IF interface circuit
IOBUF IO buffer
LAD logical address
LRNG logical address area
DLPTBL address conversion table
LY memory cell selection line
LYC layer number
LYN data write layer information
MAPREG map register
MDLCT control circuit
MNERC minimum erase count
MNGER information processing circuit
MNIPAD invalid physical offset address
MNVPAD valid physical offset address
MXERC maximum erase count
MXIPAD invalid physical offset address
MXVPAD valid physical offset address
NVCT memory control circuit
NVM nonvolatile memory device
NVMMD memory module
PAD physical address
PADTBL physical address table
PERC erase count
PPAD physical offset address
PRNG physical address area
PVLD validity flag
R storage element
RADLT row address latch
RAM random access memory
RAMC memory control circuit
REF_CLK reference clock signal
REG register
ROWDEC row decoder
RSTSIG reset signal
SA sense amplifier
SGAD physical segment address
SL chain memory array selection line
STREG status register
SWB read/write control block
SYMD clock generation circuit
Tch chain selection transistor
Tcl memory cell selection transistor
THMO temperature sensor
TNVPA total number of invalid physical addresses
TNVPA total number of valid physical addresses
WDR write driver
WL word line
WV write data verification circuit
CPUG information processing device
ROUTER router device
DYBS-CTL0 to 31 control device
STRG0 to 31 storage device
CPU0 to 31 information processing circuit
MD0 to 31 CPU memory module
M0 to 7 memory device
NVMD0 to 31 memory module
NVM0 to NVM31 nonvolatile memory device
RAM0 random access memory NVM-CTL memory control circuit
BLKTBL block size table
DLPTBL address conversion table
DLAD logical address
DPAD physical address
ERSTBL erase count table
ADMAP address map

The invention claimed is:
1. A semiconductor storage device comprising:
a nonvolatile memory; and
a control circuit that allocates a physical address to an input logical address and performs access to the physical address of the nonvolatile memory,
wherein the control circuit performs write by dynamically changing a block size of a block including the physical address of the nonvolatile memory, and
wherein the control circuit calculates a first feature amount of a write request to be input to the control circuit per the logical address within a period T, and decides the block size of the block including the physical address of the nonvolatile memory based on the first feature amount.

2. The semiconductor storage device according to claim 1, wherein
the control circuit creates a block size table which indicates the block size with respect to the logical address.

3. The semiconductor storage device according to claim 1, wherein
the control circuit allocates the smaller block size to the logical address as the first feature amount is larger.

4. A semiconductor storage device comprising:
a nonvolatile memory; and
a control circuit that allocates a physical address to an input logical address and performs access to the physical address of the nonvolatile memory,
wherein the control circuit performs write by dynamically changing a block size of a block including the physical address of the nonvolatile memory, and
wherein the control circuit calculates a second feature amount of a write request to be input to the control circuit per the logical address within a period T, and decides a capacity of a physical address area including a plurality of the physical addresses with respect to a capacity of a logical address area including a plurality of the logical addresses, based on the second feature amount.

5. The semiconductor storage device according to claim 4, wherein
the control circuit creates an address conversion table which indicates the physical address area with respect to the logical address area.

6. The semiconductor storage device according to claim 4, wherein
the control circuit allocates the larger capacity of the physical address area to the logical address area as the second feature amount is larger.

7. A nonvolatile memory control method in which a unit of erase and a unit of read are different from each other, the control method comprising:
allocating a physical address of the nonvolatile memory to a logical address in a predetermined unit;
controlling a size of the unit of erase in which a physical address allocated to a logical address is included according to a write access state with respect to the logical address in the predetermined unit;
performing a write operation by dynamically changing a block size of a block including the physical address of the nonvolatile memory;
calculating a first feature amount with respect to a write request within a period T; and
determining the block size of the block including the physical address of the nonvolatile memory based on the first feature amount.

8. The nonvolatile memory control method according to claim 7,
wherein the write access state includes at least one of an average write data amount of the logical address in the predetermined unit and a write access count of the logical address in the predetermined unit.

9. The nonvolatile memory control method according to claim 8, wherein
the write access state includes at least one of an average write data amount of all logical addresses and a write access count of all logical addresses.

10. The nonvolatile memory control method according to claim 7, further comprising
controlling the size of the unit of erase according to a read access state with respect to the logical address in the predetermined unit.

11. The nonvolatile memory control method according to claim 7, further comprising
controlling an amount of a provisional area included in the allocated physical address according to a write access state with respect to the logical address in the predetermined unit.

12. The nonvolatile memory control method according to claim 7, further comprising:
calculating a second feature amount of the write request per the logical address; and
determining a capacity of a physical address area including a plurality of the physical addresses with respect to a capacity of a logical address area including a plurality of the logical addresses, based on the second feature amount.

13. The nonvolatile memory control method according to claim 12, further comprising:
calculating the second feature amount of a write request to be input to the control circuit per the logical address within a period T.

* * * * *